(12) United States Patent
Unterreitmayer et al.

(10) Patent No.: US 9,236,860 B2
(45) Date of Patent: Jan. 12, 2016

(54) SENSOR DEVICE AND METHOD FOR GRIP AND PROXIMITY DETECTION

(75) Inventors: Reinhard Unterreitmayer, Gauting (DE); Claus Kaltner, Bergkirchen (DE); Holger Steffens, Seefeld-Hechendorf (DE); Stefan Donat, Gilching (DE)

(73) Assignee: MICROCHIP TECHNOLOGY GERMANY GMBH, Rosenheim (DE)

( * ) Notice: Subject to any disclaimer, the term of this patent is extended or adjusted under 35 U.S.C. 154(b) by 0 days.

(21) Appl. No.: 12/745,093

(22) PCT Filed: Apr. 7, 2010

(86) PCT No.: PCT/EP2010/054613
§ 371 (c)(1),
(2), (4) Date: May 27, 2010

(87) PCT Pub. No.: WO2010/115940
PCT Pub. Date: Oct. 14, 2010

(65) Prior Publication Data
US 2012/0026121 A1 Feb. 2, 2012

(30) Foreign Application Priority Data

| Apr. 7, 2009 | (DE) | ............ 10 2009 016 355 |
| Apr. 7, 2009 | (DE) | ............ 10 2009 016 356 |
| Jul. 8, 2009 | (DE) | ............ 10 2009 032 357 |
| Dec. 11, 2009 | (DE) | ............ 10 2009 057 931 |

(51) Int. Cl.
*G06F 3/044* (2006.01)
*G01N 27/00* (2006.01)
(Continued)

(52) U.S. Cl.
CPC ............ *H03K 17/962* (2013.01); *G06F 1/1613* (2013.01); *G06F 1/1684* (2013.01);
(Continued)

(58) Field of Classification Search
CPC ................. H03K 2217/960775; H03K 17/955
USPC ........ 324/600, 658, 754.01–755.11; 345/156; 340/562
See application file for complete search history.

(56) References Cited

U.S. PATENT DOCUMENTS

| 4,016,490 A | * | 4/1977 | Weckenmann et al. ........ 324/671 |
| 6,417,837 B1 | | 7/2002 | Baba .............................. 345/157 |

(Continued)

FOREIGN PATENT DOCUMENTS

| DE | 202007017303 U1 | 4/2008 | .............. G06F 3/033 |
| EP | 1093225 A2 | 4/2001 | ........... H03K 17/955 |

(Continued)

OTHER PUBLICATIONS

Chinese Office Action, Application No. 201080024912.2, 8 pages, Mar. 3, 2014.

(Continued)

*Primary Examiner* — Thomas F Valone
(74) *Attorney, Agent, or Firm* — Slayden Grubert Beard PLLC

(57) ABSTRACT

An electrical hand-held device is provided with improved proximity detection, which can be placed on a surface and has at least one transmission electrode, at least one reception electrode and at least one compensation electrode arranged between transmission electrode and reception electrode. The transmission electrode and the compensation electrode can be supplied with an electric switching signal of predetermined signal frequency and predetermined signal amplitude. Switching electric signal at the compensation electrode is phase-delayed with respect to the switching electric signal at the transmission electrode. Alternating electric fields radiated at the transmission electrode and the compensation electrode generate a current in the reception electrode, which is representative of an approach of a hand to the hand-held device. The transmission electrode and the reception electrode are arranged in such a way, that the impedance between the transmission electrode and the reception electrode exceeds a predetermined value, which is suitable to keep the current generated in the reception electrode under a predetermined value.

28 Claims, 21 Drawing Sheets

(51) Int. Cl.
*G01R 27/26* (2006.01)
*H03K 17/96* (2006.01)
*G06F 1/16* (2006.01)
*G06F 1/32* (2006.01)
*G06F 3/0354* (2013.01)

(52) U.S. Cl.
CPC ............ *G06F 1/3231* (2013.01); *G06F 1/3259* (2013.01); *G06F 3/03543* (2013.01); *H03K 2217/960775* (2013.01); *Y02B 60/1253* (2013.01); *Y02B 60/1289* (2013.01); *Y02B 60/148* (2013.01)

(56) References Cited

U.S. PATENT DOCUMENTS

| | | | | |
|---|---|---|---|---|
| 6,664,661 | B1 | 12/2003 | Palata et al. | 307/112 |
| 6,859,141 | B1* | 2/2005 | Van Schyndel et al. | 340/562 |
| 6,977,675 | B2* | 12/2005 | Kotzin | 348/208.2 |
| 7,199,783 | B2 | 4/2007 | Wenstrand | |
| 8,493,074 | B2* | 7/2013 | Unterreitmayer et al. | 324/600 |
| 2002/0093481 | A1 | 7/2002 | Kehlstadt | 345/156 |
| 2004/0125085 | A1 | 7/2004 | Kotzin | 345/169 |
| 2004/0169637 | A1* | 9/2004 | Sato | 345/156 |
| 2005/0156876 | A1* | 7/2005 | Kong | 345/156 |
| 2006/0250142 | A1* | 11/2006 | Abe | 324/663 |
| 2009/0244014 | A1* | 10/2009 | Hotelling et al. | 345/173 |
| 2010/0001955 | A1 | 1/2010 | Richter | 345/163 |
| 2012/0078278 | A1* | 3/2012 | Bales et al. | 606/169 |
| 2012/0286802 | A1* | 11/2012 | Kaltner et al. | 324/629 |
| 2013/0050139 | A1* | 2/2013 | Gute | 345/174 |
| 2013/0057299 | A1* | 3/2013 | Unterreitmayer | 324/629 |
| 2013/0187705 | A1* | 7/2013 | Kaltner et al. | 327/517 |
| 2014/0118012 | A1* | 5/2014 | Erkens | H03K 17/955 324/684 |
| 2014/0191969 | A1* | 7/2014 | Unterreitmayer | G06F 1/3231 345/163 |
| 2015/0237183 | A1* | 8/2015 | Novet | H04M 1/72569 455/556.1 |

FOREIGN PATENT DOCUMENTS

| | | | | |
|---|---|---|---|---|
| JP | 2004046386 A | 2/2004 | | G06F 1/26 |
| WO | 2008/116642 A2 | 10/2008 | | G06F 3/01 |

OTHER PUBLICATIONS

International Search Report and Written Opinion, Application No. PCT/EP2010/054613, 13 pages, Sep. 23, 2010.
Japanese Office Action, Application No. 2012-504012, 6 pages, Oct. 8, 2013.
Chinese Office Action, Application No. 201080024912.2, 8 pages, Dec. 8, 2014.

* cited by examiner

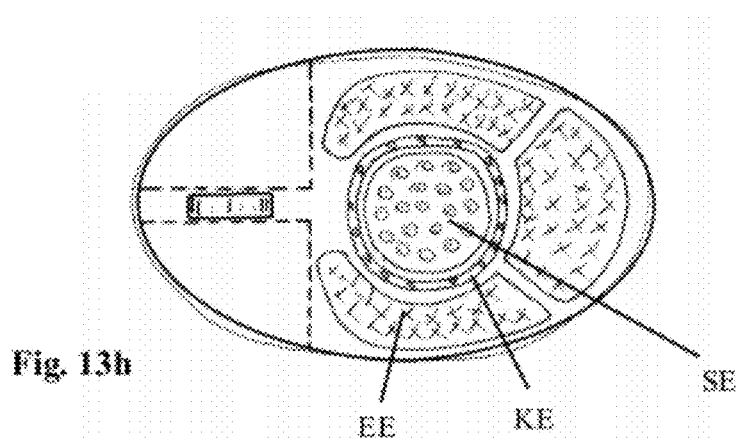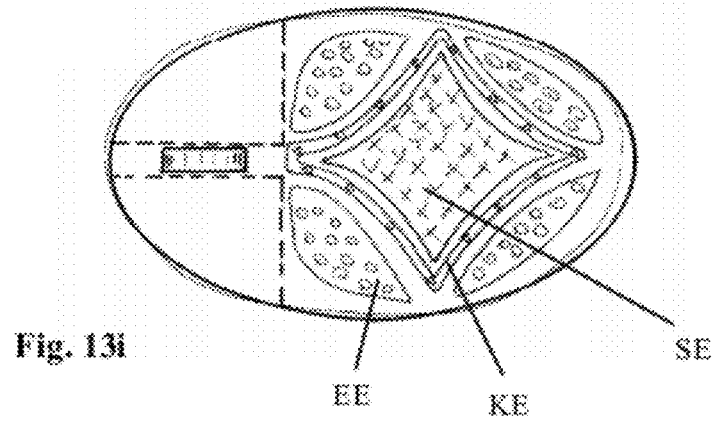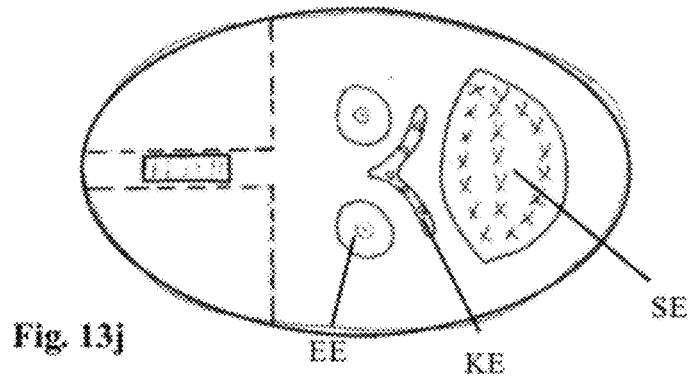

SENSOR DEVICE AND METHOD FOR GRIP AND PROXIMITY DETECTION

CROSS REFERENCE TO RELATED APPLICATIONS

This application is the US national phase of PCT application PCT/EP2010/054613, filed 7 Apr. 2010 and claiming the priority of German patent application 102009016355.7 filed 7 Apr. 2009, German patent application 102009016356.5 filed 7 Apr. 2009, German patent application 102009032357.0 filed 8 Jul. 2009, German patent application 102009057931.1 filed 11 Dec. 2009 whose entire disclosures are herewith incorporated by reference.

FIELD OF THE INVENTION

The invention refers to an electrode system for proximity detection, as well as to an electrical hand-held device with electrode system, which can be placed on a surface support and, when using a sleeping mode, can be switched to an active mode and in which the areas where the hand-held device is touched can be detected.

The invention also refers to a detection device for an electric hand-held device for detection of the hand-held device being gripped by a hand, so that in case of the hand-held device being gripped by a hand, the electric hand-held device is preferably switchable from a sleeping mode to an active mode, as well as to a method for detection of the hand-held device being gripped by a hand.

The invention also refers to an input device with the electrode system for a computerized information system, especially in the form of a computer mouse, which as such allows the processing of input processes when using a computer, especially in case of CAD-applications, of text and image processing applications, of programming works, of calculation applications, Internet navigation, as well as games.

Moreover the invention refers to an input device for game consoles, computer mice and to a mobile phone, in which the input device for game consoles. computer mice and for the mobile phone are equipped with the electrode system.

STATE OF THE ART

In the state of the art of electric devices and especially of electric hand-held devices the continuing wish emerges to improve energy efficiency. Especially in the case of portable hand-held devices, such as remote controls, input devices for game consoles or mobile phones, using exchangeable batteries or accumulators for power supply, such a wish is amplified, since batteries or accumulators must be frequently changed. An improved energy efficiency lowers on the one hand the power consumption, which leads to a higher battery or accumulator lifetime and produces on the other hand an advantageous ecologic effect, since fewer batteries or accumulators need to be disposed.

In the state of the art it is known that hand-held devices should be switched to a so-called sleeping mode when not in use. In the sleeping mode all the functions of the hand-held device, which are only necessary when using the device, are deactivated. In this way the power input of the device can be significantly reduced. When in use the hand-held device is switched to a so-called active mode, in which the full functional capacity of the device is made available.

In order to switch a hand-held device to the sleeping mode on one hand and from the sleeping mode to the active mode on the other hand, it is known that switches are provided with which the respective mode can be manually activated. This has the disadvantage that hand-held devices, also when not in use, such as for example in case of a computer mouse, often remain in the active mode, since a manual activation or deactivation of the active mode seems relatively complicated or easy to forget. Therefore, the desired energy efficiency improvement is not achieved to a great extent.

Usually computer mice allow the generation of X/Y control data by means of the corresponding movement of the computer mouse on or against a surface. These computer mice are further equipped with a key device through which selection operations can be performed. Moreover, computer mice are also often equipped with a scroll wheel through which input signals can also be generated. The keys and/or the scroll wheel of the computer mouse are also frequently developed as to bring the computer mouse into the sleeping mode or into the active mode. This requires, however, a manual action of the user.

Computer mice are increasingly formulated as cordless devices. The power supply of the computer mouse typically occurs by means of batteries or accumulators. In case of such mice, differently from conventional wired mice, an issue is that batteries need to be frequently replaced or that accumulators need to be frequently charged.

In order to avoid a manual activation or deactivation of the hand-held device active mode, the GB 2 398 138 A suggests providing the hand-held device with a wake detector, which includes a capacity sensor. When a hand-held device gets close or in contact with a hand, the hand-held device switches to the active mode automatically. When a hand is removed the hand-held device switches automatically to the sleeping mode. To detect the approaching of the hand, the capacity of the capacity sensor, which changes with the approach, is measured, in which a predetermined capacity constitutes the switching threshold for the wake-up detector.

Experiments have shown that such a wake-up detector has the disadvantage that the approaching of a hand to the wake detector is not reliably detected or, in the worst of cases, is even wrongly detected. This is especially the case, when a hand-held device is placed on an electrically conductive material, such as a table with a metal plate. Thus, the wake detector cannot reliably distinguish the electrically conductive surface from a hand. Therefore, there is the danger that the wake detector detects a hand by mistake, and the wake detector consequently switches the hand-held device to the active mode. This again remarks the fact that only a part of the desired energy efficiency improvement is achieved.

Another disadvantage of the solutions known from the state of the art, is that the approaching to different areas of a hand-held device or an approach from different directions is not detectable. Equally, with the known solutions it cannot be determined which areas of the hand-held device are to be touched.

The object of the present invention is that of providing solutions for an electrical hand-held device, by means of which the approaching of a hand to the hand-held device can be reliably detected and areas of a hand-held device can be identified where an approach and/or a contact occurs or the direction from which the approaching comes. It is also an object of the present invention to provide solutions by which the hand-held device being gripped by a hand is reliably detectable, in order to switch the hand-held device for example to an active mode only in case of a grip.

Solution According to the Invention

According to the invention, this object is achieved by means of a hand-held device, an electrode system, a detection device for an electric hand-held device, a hand-held device with a detection device as well as by means of a method for detecting the hand-held device being gripped by a hand, according to the independent claims.

Thus, the invention provides an electrical hand-held device, which can be placed on a surface, provided with at least one transmission electrode, at least one reception electrode and at least one compensation electrode arranged between the transmission electrode and the reception electrode, by means of which the approach of a hand to the hand-held device is detectable, in which from the transmission electrode a first electrical alternating field may be radiated and from the compensation electrode a second electrical alternating field may be radiated, in which the first alternating electric field with respect to the second alternating electric field is phase-delayed and in which the alternating electric fields may be coupled into the surface and into the reception electrode, in which the alternating electric fields coupled into the reception electrode generate a current in the reception electrode, which is representative of the approaching of the hand to the hand-held device, in which the transmission electrode and the reception electrode on the hand-held device are arranged in such a way that the sum of the impedances between the transmission electrode and the reception electrode, which consists of the impedance between the transmission electrode and the surface, the impedance of the surface and the impedance between the surface and the reception electrode, exceeds a predetermined value $Z_0$ as the hand-held device is placed on the surface, the predetermined value $Z_0$ being suitable to keep the current generated in the reception electrode under a predetermined value $I_0$.

Being between the transmission electrode and the reception electrode at least one compensation electrode arranged, it is possible, in an easier and more reliable way, to detect the approach of a hand to the hand-held device, even if the hand-held device is placed on an electric conductive surface. Through the corresponding arrangement of the transmission electrode and of the reception electrode, in which the impedance between the transmission electrode and the reception electrode exceeds a predetermined value $Z_0$, the current generated through the alternating electric fields in the reception electrode does not suffice to switch the hand-held device from a sleeping mode into an operational or active mode. With the help of the alternating electric field emitted at the compensation electrode, a sufficiently high current from the transmission electrode to the receiver electrode (roughly over the wall of the hand-held device) is moreover prevented, which would suffice to switch the hand-held device to the active mode.

An approach may include a reduction of the distance between hand and hand-held device and/or a change of the position of the hand with respect to the electrodes on the hand-held device.

The transmission electrode and the compensation electrode may be supplied with an electric alternating quantity of predetermined frequency and predetermined amplitude, whereas the electric alternating quantity at the transmission electrode with respect to the electric alternating quantity at the compensation electrode is phase-delayed. The amplitude of the electric alternating quantity at the transmission electrode may be different from the amplitude of the electric alternating quantity at the compensation electrode.

With the increasing approach of a hand to the hand-held device, the alternating electric field transferred through the hand from the transmission electrode to the reception electrode experiences a fader and fader compensation through the alternating electric field of the compensation electrode.

The surface also comprises contact surfaces. A contact surface may be for example a wall, on which the hand-held device is arranged in the form of a tiltable lever.

Moreover an electrical hand-held device is provided, which can be placed on a surface, comrising several electrode structures or electrode systems, whereby respectively at least one transmission electrode, at least one reception electrode and at least one compensation electrode between the transmission electrode and the reception electrode are arranged, whereby with any of the several electrode structures an approach of a hand to the hand-held device may be detected, whereby any of the several electrode structures is designed in such a way, that from the transmission electrode a first electrical alternating field and from the compensation electrode a second electrical alternating field are radiated, whereby the first alternating electric field with respect to the second alternating electric field is phase-delayed and whereby the alternating electric fields may be coupled into the surface and into the reception electrode, the alternating electric fields coupled into the reception electrode generate a current in the reception electrode, which is representative of the approach of a hand to the electrode structure on the hand-held device, and the transmission electrode and the reception electrode are arranged in such a way on the hand-held device, that the sum of the impedances between the transmission electrode and the reception electrode, which consists of the impedance between the transmission electrode and the surface, the impedance of the surface, and the impedance between the surface and the reception electrode, exceeds a predetermined value when a hand-held device is placed on the surface, which is suitable to keep the current generated in the reception electrode under a predetermined value.

The provision of several such electrode structures allows to advantageously detect the approaching of a hand to several areas of the hand-held device or to reliably identify the direction of the approach.

The several electrode structures may be coupled with an electronic evaluation device, whereby the electronic evaluation device is designed to successively evaluate the approach of a hand to each of the several electrode structures.

The several electrode structures may also be coupled with a respective electronic evaluation device, whereby each electronic evaluation device is adapted to evaluate the approach of a hand to the respective connected electrode structure.

It is advantageous when the transmission electrode, the compensation electrode and the reception electrode of each of the several electrode structures are arranged on the hand-held device in such a way that they do not touch the surface when the hand-held device is placed on the surface.

With this advantageous arrangement, the production of a galvanic contact between the transmission electrode and the reception electrode is avoided, when the hand-held device is placed on an electrically conductive surface, which could reduce the sensitivity of the detection.

The transmission electrode, the compensation electrode and the reception electrode of each of the electrode structures may be arranged on the surface of the hand-held device.

The transmission electrode, the compensation electrode and the reception electrode of each of the electrode structures may also be arranged on the side of the hand-held device facing the surface.

The surface of the hand-held device also comprises the external sides of the hand-held device. In this way for example any single electrode or all electrodes may be arranged on the outside and be visible to the user. Single or all electrodes may however also be directly arranged below the surface of a hand-held device, so that they are not visible to the user and they are additionally better protected.

Advantageously, in any of the several electrode structures, the alternating electric field radiated at the compensation electrode, interferes at least partially with the alternating electric field radiated at the transmission electrode, which determines a reduction in the level of the alternating electric field resulting from the superposition and which leads to a reduction of the current generated into the reception electrode.

Another advantage of the compensation electrode consists in the fact that besides the alternating electric field, emitted at the transmission electrode, also the alternating electric field emitted at the compensation electrode is coupled in the surface, so that, regardless of the surface material, the alternating electric field emitted at the compensation electrode interferes with the alternating electric field emitted by the transmission electrode. In this way an approaching of a hand, regardless of the surface material, can be reliably detected.

In any of the several electrode structures a first approach of a hand to the hand-held device may cause a change of the sum of the impedances between the transmission electrode and the reception electrode, comprised between the predetermined value $Z_0$ and a further predetermined value $Z_1$, with $Z_0 > Z_1$, and which is suitable to bring the current generated in the reception electrode over the predetermined value $I_0$.

The first approach may for example comprise a distance of a hand from the electrodes and/or a position of a hand with respect to the electrodes.

In each of the several electrode structures, a second approach of a hand to a hand-held device may cause a change of the sum of the impedances between the transmission electrode and the reception electrode, which is below the further predetermined value $Z_1$ and which is suitable to bring the current generated in the reception electrode over a second predetermined value $I_1$, with $I_1 > I_0$.

The second approach may further include a distance of a hand from the electrodes and/or a position of a hand with respect to the electrodes, in which the second approach is different from the first approach. So the distance of a hand from the electrodes in the second approach may be for example smaller than that in the first approach in order to cause an increase of the amperage in the reception electrode over the predetermined value $I_1$.

Equally the amperage increase in the reception electrode over the predetermined value $I_1$ can be achieved through the position of the hand with respect to the electrodes, even when the distance of the hand in the second approach is smaller than in the first approach.

The arrangement of the electrodes has the advantage that in an approach of a hand to the hand-held device or in the gripping of the hand-held device, the impedance between the transmission electrode and the reception electrode decreases in such a way that the alternating electric field coupled into the reception electrode suffices to bring the current generated in the reception electrode over a first value $I_0$ (when approaching) or over a second value $I_1$ (when gripping or with a further approach).

In this way a sleeping mode, a switch mode and an active mode of the hand-held device, may be advantageously induced with a control means coupled with the reception electrode in which the currents $I_0$ and $I_1$ serve as threshold values. The provision of a switch mode (as inter-stage between the sleeping mode and the active mode) has the further advantage that already in a corresponding approach of a hand, the hand-held device may be prepared for the active mode, for example by starting an initialization process. The feeling of a delayed activation can therefore be avoided by the user of the hand-held device.

It is particularly advantageous to construe the transmission electrode, the reception electrode and the compensation electrode of at least one of the several electrode structures in such a way that the approaching of the hand to the hand-held device causes a rise in the level of the alternating electric field resulting from the interference, and a reduction of the impedance between the transmission electrode and the reception electrode.

It is particularly advantageous, when the ratio of the level $P_1$ of the resulting alternating field in the first approach with respect to the level $P_2$ of the resulting alternating field in the second approach is smaller than the ratio of the impedance $Z_2$ between transmission electrode and reception electrode in the second approach with respect to the impedance $Z_1$ between transmission electrode and reception electrode in the first approach. Levels and impedances in the first and second approach behave to one another as follows:

$$\frac{P_1}{P_2} < \frac{Z_2}{Z_1}$$

In this way it is possible to advantageously guarantee, that as the approach of a hand to a hand-held device increases, also an activation of the switch mode or the active mode occurs, since the sensitivity of the electrode arrangement on the hand-held device improves as the hand approaches.

The transmission electrode, the reception electrode and the compensation electrode of at least one of the several electrode structures may be asymmetrically arranged to determine a left/right-distinction of the approaching hand. Depending on the distinction, a predetermined function of the device may be performed.

With a left/right-distinction of the approaching to the hand-held device, a distinction between right-handed and left-handed may also be advantageously performed, in order to arrange a menu direction on a display provided on the hand-held device on the left or on the right of the display accordingly.

The alternating electric field radiated from at least one compensation electrode of the several electrode structures may be provided for an adaptation of the predetermined values $I_0$ according to the electric field surrounding the hand-held device.

The threshold value of the current, being sufficient for a hand-held device to pass from the sleeping mode to the switch mode or to the active mode, can therefore be adapted through the hand-held device itself to different surface materials.

With the arrangement of several electrode structures on a hand-held device it is possible to detect in a particularly simple way, if a user holds a hand-held device with a hand or with both hands, preferably in specific areas of the hand-held device.

Further, a detection device is provided for an electrical hand-held device for detection of the hand-held device being gripped by a hand, wherein the detection device has a transmission electrode, a reception electrode and a compensation electrode, wherein the transmission electrode and the compensation electrode are galvanically coupled to each other, wherein the transmission electrode, the reception electrode and the compensation electrode are separated from each other on the hand-held device, and wherein the reception electrode and the compensation electrode may be arranged on the hand-held device in such a way that they can be coupled in a capacitive way. The transmission electrode may be supplied with a first alternating electric voltage, so that a first alternating electric field may be irradiated by the transmission electrode, wherein the first alternating electric voltage on the galvanic coupling is coupled to the compensation electrode, and wherein the compensation electrode may be supplied with a second alternating electric voltage, whereby a second alternating electric field may be irradiated by the compensation electrode, which results from the first alternating electric voltage and the second alternating electric voltage, whereby the second alternating electric field is coupled to the reception electrode, in order to generate a first current, and whereby the first alternating electric field, when the hand-held device is gripped by a hand, may be coupled to the reception electrode, in order to generate a second current there, in which the total current resulting from the first current and the second current indicates a grip of the hand-held device.

The galvanic coupling of the transmission electrode with the compensation electrode results in that the alternating electric field irradiated on the compensation electrode and coupled to the reception electrode depends on the alternating voltages, by which the compensation electrode and the transmission electrode are supplied. The alternating electric field coupled on the reception electrode generates a current there, which serves as a threshold value. This current is adjustable, by changing the alternating electric voltage on the compensation electrode relative to the alternating voltage on the transmission electrode.

It is advantageous for the first alternating voltage and the second alternating voltage to have the same signal form and be phase-delayed one relative to the other.

The transmission electrode and the reception electrode may be coupled with an evaluation electronics, which is designed in order to detect the hand-held device being gripped by a hand, based on a change of the total current of the hand-held device.

The transmission electrode and the reception electrode are preferably arrangeable in such a way on the hand-held device that they do not touch the surface of a hand-held device placed on a surface.

The distance between the transmission electrode and the surface and/or the distance between the reception electrode and the surface is thereby preferably selected in such a way that the impedance between the transmission electrode and the reception electrode does not exceed a predetermined value, whereby the impedance set between the transmission electrode and the reception electrode is the impedance between the transmission electrode and the surface, the impedance of the surface, and the impedance between the surface and the reception electrode, and whereby the predetermined value is selected in such a way that the alternating electric field irradiated on the transmission electrode cannot be coupled to the reception electrode.

The transmission electrode, the compensation electrode and the reception electrode may be arranged on the top surface of the hand-held device.

The transmission electrode and the compensation electrode are coupled with a signal generator, wherein the transmission electrode and the compensation electrode are coupled to each other by means of a first, preferably adjustable phase shifter and/or wherein the signal generator is coupled by means of a second, preferably adjustable phase shifter.

Preferably the evaluation electronics consists of a control means, which is designed in such a way that a predetermined total current determines a switching-on mode and/or an active mode of the hand-held device.

The first current on the reception electrode is adjustable by changing the phase between the first alternating voltage and the second alternating voltage. Advantageously this is accomplished by phase shifters.

The transmission electrode, the reception electrode and the compensation electrode may be arranged on the surface or near below the surface of the hand-held device.

It is particularly advantageous to arrange the transmission electrode on a first sidewall of the hand-held device, and the reception electrode and the compensation electrode on a second sidewall, opposite the first sidewall.

Moreover a method for detection of a hand-held device being gripped by a hand with a detection device is provided by the invention, wherein the detection device has at least one transmission electrode, one reception electrode and one compensation electrode, whereby the transmission electrode is galvanically coupled with the compensation electrode and whereby the compensation electrode may be capacitively coupled with the reception electrode, whereby the transmission electrode may be supplied with a first alternating electric voltage, so that a first alternating electric field is irradiated on the transmission electrode, and whereby the first alternating electric voltage is at least partially coupled by galvanic coupling to the compensation electrode, the compensation electrode is supplied with a second alternating electric voltage, so that a second alternating electric field is irradiated on the compensation electrode and coupled to the reception electrode, whereby the second alternating electric field coupled to the reception electrode generates a first current in the reception electrode, and whereby a total current is evaluated in the reception electrode, whereby the total current results from the first current and from a second current, whereby the second current is generated through capacitive coupling of the first alternating electric field to the reception electrode, when a hand grips the hand-held device, and whereby the total current indicates that the hand-held device has been gripped by a hand.

On the hand-held device several detection devices may be provided according to the invention, in order for example to reliably detect the grip of the hand-held device at different positions of the hand-held device.

Furthermore, a hand-held device is provided with:

a casing device, a shifting detection device to generate control data which correlate as such with the shifting of the case device into a X- and a Y-axial direction, and a hand detection device to generate signals which describe as such the proximity status of a hand with respect to the casing device, whereby:

the hand detection device comprises an electrode group with three field electrodes, and a circuit device coupled with these field electrodes, the circuit device is constructed in such a way that the field electrodes are respectively supplied with a generator voltage alternating on an operating frequency, and a tapping circuit is provided to generate an electrode signal that is conducted to a signal control unit.

The hand-held device may be for example a computer mouse, an input device for game consoles, a mobile phone or a portable minicomputer.

In this way it is advantageously possible, with an extremely small power demand, to perform a detection of approaching occurrences and to activate the remaining electronics of an hand-held device, for example mouse electronics, only when an approach of a hand is detected.

Preferably the tapping circuit is developed in such a way that the impedance at the signal input shows a minimum amount in the operating frequency range. In this respect the signal amplification is handled preferably in such a way that in case of the smallest possible steepness, it experiences an operationally stable maximum.

In advantageous way, successive further signal amplification occurs, in which the output impedance of tapping circuit is preferably coordinated in such a way that at the exit of tapping circuit, a DC-output signal deriving directly from the AC-input signal of the field electrode occurs. This DC-output signal is conducted to a signal control unit performed as a module enclosed in it.

Preferably, the generator device is directly included into the signal control unit. It is possible to connect the tapping circuit to the signal control unit in such a way that the first reinforcing step of the tapping circuit through the signal control device is supplied with tension.

The signal control device is preferably laid out in such a way that a sleeping mode and an active mode may be determined through it. In the course of the sleeping mode the detection of the approaching status takes place at intervals separated by pauses.

The invention further provides an electrode system to be arranged on a hand-held device with at least one transmission electrode, one reception electrode and one compensation electrode, in which the compensation electrode may be arranged between the transmission electrode and the reception electrode, in which the electrode system is developed in such a way that from the transmission electrode a first alternating electric field and from the compensation electrode a second alternating electric field are radiated, in which the first alternating electric field is phase-delayed with respect to the second alternating electric field and in which the alternating electric fields may be coupled into the reception electrode, and the alternating electric fields coupled into the reception electrode generate a current in the reception electrode, which is representative of an approach of a hand to the electrode system.

It is advantageous when the transmission electrode and the reception electrode are arranged on the hand-held device in such a way that the impedance between the transmission electrode and the reception electrode, in case the hand-held device is placed on a surface, exceeds a predetermined value $Z_0$, which is suitable to hold the current generated in the reception electrode under a predetermined value.

The approaching of a hand to the electrode system on a hand-held device can therefore be reliably detected regardless of the material of the surface on which hand-held device is placed.

The impedance between the transmission electrode and the reception electrode is, in case of a hand-held device placed on the support surface, the sum of the impedances between the transmission electrode and the reception electrode, which consists of the impedance between the transmission electrode and the surface, the impedance of the surface and the impedance between the surface and the reception electrode.

The electrode system may be coupled with an electronic evaluation device, in which the electronic evaluation device is preferably adapted to evaluate an approach of a hand to the electrode system and to provide a signal representative of the approach. The signal may for example be conducted for further processing to a microcontroller, for example the control unit of a game console.

The invention provides a hand-held device, in particular a computer mouse, a remote control device, a mobile phone or an input device for a game console, with at least one electrode system according to the invention.

In case of a hand-held device with several electrode systems an approach to any of the electrode systems may be detected. In this way for example a hand-held device may be provided, which may be only activated, when it is touched with both hands on determined areas.

The invention also provides a circuit arrangement for generating an output signal which is indicative for the dielectric properties of an observation area of at least one capacitive sensor element, wherein the at least one capacitive sensor element comprises at least one transmitting electrode, at least one compensation electrode and at least one receiving electrode, and wherein the circuit arrangement comprises a signal generator device for charging the transmitting electrode with a first alternating electrical signal and the compensation electrode with a second alternating electrical signal, wherein the second alternating electrical signal is different from the first alternating electrical signal, a signal processing device which is coupled with the receiving electrode, for processing an electrical electrode signal measured at the receiving electrode and for providing a processed signal, and an evaluator, to which the processed signal can be conducted, for the evaluation of the processed signal and for the production of the output signal depending on the evaluation.

The electrodes of the capacitive sensor element can thus be arranged on a handset in such a way that, based on a capacitive coupling of the transmitting electrode with the receiving electrode via a hand, a grip of the handset by the hand can be detected.

The signal processing device may comprise an amplifying device for providing an electrical signal corresponding to the electrical electrode signal measured at the receiving electrode, and a digitization device to which the electrical signal of the amplifying device is conducted for digitalizing the electrical signal and for providing the processed digitalized signal.

The amplifying device may comprise a current/voltage transformer with a downstream voltage amplifier.

The voltage gain of the voltage amplifier may be adjustable.

The current/voltage transformer may comprise a transimpedance amplifier.

The transimpedance of the current/voltage transformer may be adjustable.

The amplifying device may be coupled with a first rectifier.

The amplifying device may be coupled with a second rectifier.

The output of the first rectifier and the output of the second rectifier may each be coupled with a filter, in order to smooth the signal applied at the respective rectifier.

The digitization device may comprise two analog-digital converters, wherein the outputs of the filters are each coupled with one of the two analog-digital converters.

The digitization device may comprise a multiplexer, in order to conduct the signals applied at the outputs of the filters to an analog-digital converter, wherein preferably the signals applied at the outputs of the filters are each scanned by a sample-hold circuit before they are conducted to the analog-digital converter.

Preferably, a subtractor is provided, to which the demodulated and smoothed output signals of the filters are conducted, and wherein a differential signal of the subtractor is conducted to the digitization device.

The first rectifier and the second rectifier may be designed as electronically controllable switches which are opened and/or closed each synchronously to the flanks of the first alternating electrical signal.

The digitization device may be operated synchronously to the first alternating electrical signal such that the electrical signal conducted to the digitization device is scanned twice per period, wherein the scanning phase is selected in such a way that in each of the first and the second semi-period of the scanning a peak value of the conducted electrical signal is scanned and digitalized.

The signal generator device may comprise:
 a signal generator which generates the first alternating electrical signal, and an inverter for generating the second alternating electrical signal from the first alternating electrical signal, wherein an attenuator is downstream to the inverter in order to attenuate the second alternating electrical signal;
 a first signal generator which generates the first alternating electrical signal, and a second signal generator which generates the second alternating electrical signal, wherein the frequency of the first alternating electrical signal basically corresponds to the frequency of the second alternating electrical signal; or
 a signal generator which generates the first alternating electrical signal and a phase shifter for generating the second alternating electrical signal from the first alternating electrical signal.

The first alternating electrical signal may be inverted with the inverter. The inverted alternating electrical signal may be attenuated with the attenuator, so that the amplitude of the inverted alternating electrical signal is reduced. A second alternating electrical signal is thus advantageously provided which is basically dephased by 180° from the first alternating electrical signal and comprises an amplitude which is smaller than the amplitude of the first alternating electrical signal.

The evaluator may comprise at least one of the group microcontroller, comparator, and finite automaton.

SHORT DESCRIPTION OF THE DRAWINGS

Further details and characteristics of the invention derive from the following description associated with the drawing. It shows:

FIG. 1 hand-held device with an electrode arrangement according to the invention (bottom view as well as a corresponding cross-section and longitudinal section);

FIG. 2a-2c side view of a hand-held device, in its sleeping mode (without hand), in its switch mode (when a hand approaches) and in its active mode (when a hand grips the hand-held device);

FIG. 3 a principle sketch to illustrate the field bridging;

FIG. 4 an asymmetric electrode arrangement (above) for the right/left-distinction with two corresponding current courses on the reception electrode (below);

FIG. 5 an alternative electrode arrangement on a hand-held device;

FIG. 6 an input device with two zones each provided with an electrode structure;

FIG. 7 examples of the detection of the approach to a hand-held device or of a contact with a hand-held device provided with several electrode structures;

FIG. 8 a circuit arrangement according to the invention for electric-field proximity detection for the power-up and power-down of a cordless computer mouse;

FIG. 9 a principle sketch to illustrate a first electrode arrangement;

FIG. 10 a principle sketch to illustrate the field bridging in the electrode arrangement according to FIG. 9;

FIG. 11 a circuit sketch to illustrate a preference structure of a tapping circuit according to the invention, used for signal processing;

FIG. 12 a principle sketch to illustrate a preference structure of the MCU working as operating circuit and as interface for external hardware;

FIGS. 13a-13j further representations to illustrate variants according to the invention of the conformation of the electrode trio according to the invention;

FIG. 14 another circuit sketch to illustrate the structure of a further signal-processing module;

FIG. 15 a principle sketch of a block diagram of the detection device according to the invention;

FIG. 16 the block diagram of a detection device according to the invention from FIG. 15 with a hand, where the grip of a hand-held device is detected by an alternating electric field coupled by the hand on a reception electrode of the detection device according to the invention;

FIG. 17 an embodiment of an electrode arrangement according to the invention on a hand-held device;

FIG. 18 a block diagram of a circuit arrangement according to the invention with the three main components, for the explanation of the functional principle of the circuit arrangement according to the invention;

FIG. 19 a concrete embodiment of a circuit arrangement according to the invention;

FIG. 20 a further concrete embodiment of a circuit arrangement according to the invention;

FIG. 21 a further example of a concrete embodiment of a circuit arrangement according to the invention;

FIG. 22 a further example for a concrete embodiment of a circuit arrangement according to the invention;

FIG. 23 a further example of a concrete embodiment of a circuit arrangement according to the invention;

FIG. 24 an example for the arrangement of the electrodes of a capacitive sensor element on the housing of an electric handset; and FIG. 25 an example for a concrete embodiment of the electrodes of a capacitive sensor element.

The basic functioning of a proximity detection according to the invention e.g. of a hand to a hand-held device is initially explained.

According to the invention, three electrodes are provided for proximity detection. These three electrodes are indicated as transmission electrode SE, reception electrode EE and compensation electrode KE. The reception electrode EE is connected to the signal input of an evaluation device or of a control device. The transmission electrode SE and the compensation electrode KE are each coupled with a signal generator, which provides an electric alternating quantity with a determined frequency and amplitude. This electric alternating quantity is in the following indicated as alternating signal or electric alternating signal.

The transmission electrode SE, the reception electrode EE and the compensation electrode KE build, according to an embodiment of the invention, an electrode structure or an electrode system. Several such electrode structures or electrode systems can be provided on a hand-held device, whereby each of the electrode systems for the proximity detection of a hand can be provided on the hand-held device. Such a hand-held device is described more closely with reference to FIG. 6 and FIG. 7.

The electrodes SE, EE and KE are arranged for example at the bottom of a hand-held device, for example a remote control. The compensation electrode KE is preferably arranged between the transmission electrode SE and the reception electrode EE, as shown for example in FIG. 1 or FIG. 5.

The transmission electrode SE is supplied by the signal generator with an electric alternating signal, which can have a frequency, comprised between 50 KHz and 300 KHz and amplitude, which should not exceed the value of 20 V, so that it doesn't determine an unpleasant feeling in the user.

The compensation electrode KE is also supplied with an electric alternating signal, which has preferably the waveform and the frequency of the electric alternating signal with which the transmission electrode SE is supplied. The electric alternating signal of the compensation electrode KE is phase-delayed with respect to the electric alternating signal of the transmission electrode SE. The phase shifting can be accomplished for example with a phase-shifter, arranged between the signal generator and the transmission electrode or the compensation electrode.

The transmission electrode SE or the electric alternating signal supplied to it is laid out in such a way, that the alternating electric field emitted by the transmission electrode SE can be coupled in the reception electrode EE. The compensation electrode KE or the electric alternating signal supplied to it is laid out in such a way that the alternating electric field emitted by it can also be coupled into the reception electrode EE. Through the alternating electric field emitted at the compensation electrode KE, which is phase-delayed with respect to the alternating electric field emitted by the transmission electrode, the level of the alternating electric field acting on the reception electrode EE is reduced or in case of an opposite-phase interference (almost) deleted.

In case several electrode systems are provided on a hand-held device, which should detect an approach independently of each other, attention should be paid to the fact that the electrode systems do not interfere in such a way that a reliable detection can no longer be guaranteed. Such an arrangement can be empirically determined according to the casing. In an embodiment, which is not closely described here, between the electrode systems at least one additional compensation electrode can be provided. This additional compensation electrode can for example be used to delete the alternating electric field radiated by a transmission electrode of an electrode system, so that it does no longer affect the reception electrode of the other electrode system.

With the approaching of a hand to the electrodes the alternating electric field acting on the reception electrode EE is modified so that it generates a current on the reception electrode EE, which is representative of an approach of a hand to the electrodes. In case of a hand approaching to the electrodes, the coupling between transmission electrode SE and reception electrode EE through the hand improves. This improving coupling leads to have a current increase in the reception electrode. The correlation between an approaching hand and the current generated on the reception electrode is described more closely with reference to figures from $2a$ to $2c$.

The overall system is laid out in such a way that, as long as no hand is near the electrodes, the current generated on reception electrode EE does not exceed a predetermined value. This is achieved though a corresponding arrangement of the transmission electrode SE and the reception electrode EE in the casing. The arrangement is done in such a way that the impedance between transmission electrode SE and reception electrode EE is big enough, so that in the reception electrode EE only one current is generated, which does not suffice to transfer the device from the sleeping mode to the switch mode.

The proximity detection principle lies in the detection of a sufficiently ample electric value, which is representative of the admittance between the transmission electrode SE and the reception electrode EE. This is accomplished by measuring the amperage in the receiver or in the reception electrode EE. Basically, the amperage measured between the transmission electrode SE and the reception electrode EE grows with the increase of the electrode surfaces and diminishes with the increase of the current electrode spacing. Thus, similar laws apply as for the effective capacity in a plate capacitor.

In order to guarantee a particularly good detection of an approaching hand, compensation current is provided in the transmission system between transmission electrode SE and reception electrode EE. This (for the transmission current phase-delayed or opposite-phase) compensation current interferes with the transmission current. The freedom degrees to determine the compensation current strength lie in the first place in the measurements of the connected electrode surfaces. In the second place the phase of the compensation current (with reference to transmission current) can be varied. Eventually, an adaptation of the alternating signal as for frequency and/or tension can also occur.

In a preferred embodiment of the invention the quantity of the available freedom degree is reduced, in that it works only with firmly impressed tensions at transmission electrode SE and at the compensation electrode KE.

Further freedom degrees are omitted when the coarse tuning of the measuring system takes place only once in the construction of the overall system. This coarse tuning consists on thr one hand in the single determination of the arrangement and profile of all performed electrodes on the hand-held device and on the other hand in the single adjustment of the phase difference between transmission and compensation signal.

The remaining freedom degrees are used for a fine-tuning of the measuring arrangement. They lie for example in a dynamic vernier adjustment of the phase difference between the transmission and compensation signal and/or in the position shifting of threshold value points, that are typically used to transfer an analogue transmission parameter into a logic derived switching function. The calculation of this electric threshold values can derive for example from firmly preset standard values in the controlling firmware and/or from already validated measured quantities and/or measuring profiles, which are for example cyclically firmly deposited in the memory area of the evaluating digitalization. In the fine-tuning also past measured values can flow in.

The precise arrangement of the single electrodes on the housing or the respective measures as well as the precise characteristics (frequency and amplitude) of the alternating electric signal, with which transmission electrode SE and compensation electrode KE are supplied, depend on the actual shape and size of the device. Electrode arrangement, electrode measures and characteristics of the alternating signal can be empirically determined for an actual device and mutually calibrated to one another so that the above described requirements referring to the current generated at the reception electrode EE are able to allow a reliable detection.

An example of a possible electrode arrangement at the bottom of a hand-held device is described in FIG. 1.

FIG. 1 shows a possible arrangement of a transmission electrode SE, a reception electrode EE and a compensation electrode KE at a remote control device (viewed on the device bottom as well as on each section along the transverse and longitudinal axis of the remote control device). The compensation electrode KE is arranged between transmission electrode SE and reception electrode EE. The alternating electric field acting on the reception electrode EE will be dampened or extinguished, depending on the compensation electrode KE emitted in the alternating electric field.

In FIG. 1 it can be seen, that the arrangement of electrodes and especially transmission electrode SE and reception electrode EE are arranged on the equipment bottom in such a way, that they do not touch a surface when placed thereon. This arrangement is important particularly in case of conductive electric surfaces, in order to avoid a direct current path between transmission electrode SE and reception electrode EE, which could withdraw from the influence sphere of the compensation electrode KE.

The two compensation electrodes KE shown in FIG. 1 can be electrically connected to each other. Alternatively one of the compensation electrodes KE may also be provided for the system adjustment. For this purpose both compensation electrodes KE must not be electrically connected to each other.

The electrodes shown in FIG. 1 may also be comparably arranged in a mobile phone or an input device for game consoles.

With reference to the drawings shown from FIG. 2a to FIG. 2c the functioning of the electrode arrangement is explained more closely.

FIG. 2a shows a remote control device placed on a surface without approach of a hand. The remote control device is set on the "sleeping mode", in which the power need throughout the remote control device can be reduced to a minimum.

FIG. 2b shows a remote control device with an approaching hand. For this purpose the remote control device "awakes" from the sleeping mode and shifts into a "switch mode". In the switch mode various activation or initialization functions can be performed, so that when the remote control device is gripped, its functions are fully available.

An example of an activation function is the switching on of a remote control device display. Another example is the switching on of a key lighting. The activation function can be set in combination with a photosensor, so that the key lighting only activates beneath a predetermined light intensity.

FIG. 2c shows a remote control device, held by a human hand. The remote control device is now set in the "active mode" and is made available with its full unrestricted functioning.

Transmission electrode SE and reception electrode EE are arranged at the housing bottom (cf also FIG. 1), so that the sum of impedances between the transmission electrode SE and the reception electrode EE is big enough, so that the emitted field of the transmission electrode SE experiences in any circumstance a sufficient damping. Through the damping signal in reception electrode only a current is generated, which does not suffice to switch the device from the sleeping mode into the switch mode. The electrode geometry of both electrodes as well as their arrangement to one another can be determined with predetermined generator voltage and generator frequency simply in an empirical way. In this way the electrode surface of the single electrodes and/or the distance between electrodes and/or the position of electrodes, and/or electrode material, can be adapted to one another in order to achieve corresponding impedance between the transmission electrode SE and the reception electrode EE.

The sum of the impedances between the transmission electrode SE and the reception electrode EE consists of:
  impedance between transmission electrode SE and surface,
  impedance of the surface itself, and
  impedance between surface and reception electrode EE.

The impedance of the surface can be close to zero.

Should the surface consist of an electric conductive material, the better coupling between the transmission electrode SE and the reception electrode EE, through radiation of the compensation electrode signal KE (the emitted alternating electric field thereof operates on the surface as well) is nullified. In the amperage generated on the reception electrode EE, no significant difference results, depending on the support material.

A current quantity sufficient for the "awakening" from the transmission electrode SE to the reception electrode EE through the surface and/or the wall of the remote control device, is prevented with the aid of the emitted alternating electric field of the compensation electrode KE.

When a human hand (as shown in FIG. 2b) approaches the remote control device, the current in the reception electrode exceeds a predetermined threshold value of $I_0$ to switch or awaken the remote control device. The threshold value $I_0$ is preferably determined considering the E-Field-characteristics surrounding the remote control device, therefore an additional compensation electrode KE can be provided for adjustment.

When a hand is approaching, the increased current flow results from the reducing damping signal between the transmission electrode SE and the reception electrode EE. For this purpose two effects play an essential role:
a) the coupling of the first electrode with the thumbs improves (depending on which hand touches the remote control device, the first electrode is the transmission electrode SE or reception electrode EE). The hand, from the thumb to the four fingers, has very small impedance. The coupling of the four fingers onto the second electrode also improves.
b) the signal path (transmission/reception electrode-hand-reception/transmission electrode) conducts the compensation electrode KE, so that the influence of the alternating electric field of the compensation electrode KE on the alternating electric field coupled with the reception electrode EE decreases.

In this way the alternating field transmitted through the hand from the transmission electrode SE to the reception electrode EE also experiences an increasing weaker compensation through the alternating electric field of the compensation electrode KE. It is in this important that the effect of compensation electrode KE in the entire system is not excessively dominant; otherwise the approach of a human hand would be "electrically hidden".

Should successively the remote control device be eventually fully gripped by a human hand (cf FIG. 2c), the current in reception electrode EE would exceeds another predetermined threshold value $I_1$, to activate the remote control device completely. The threshold value $I_1$ is also preferably determined taking into account the E-Field-characteristics surrounding the remote control device, previously possessed by the device on the support without approach of a human hand. Should a hand-held device be equipped with two or more electrode systems, the threshold values $I_0$ and $I_1$ for each electrode system can be differently defined.

It is advantageous when the electrodes are so arranged to one another, that levels and impedances behave to one another as follows:

$$\frac{P_1}{P_2} < \frac{Z_2}{Z_1}$$

whereby $P_1$ is the level of the resulting alternating field in the first approach (=hand approach, in which the device shifts from the sleeping mode to the switch mode), $P_2$ is the level of the resulting alternating field in the second approach (=hand approach, in which the device shifts from the switch mode to the active mode), $Z_1$ is the impedance between the transmission electrode and the reception electrode in the first approach, and $Z_2$ is the impedance between the transmission electrode and the reception electrode in the second approach.

An electrode arrangement, meeting this requirement, can be empirically determined. With an electrode arrangement meeting these requirements, the sensitivity of the electrode arrangement can improve, as a hand approaches the device.

The alternating electric field emitted from the compensation electrode KE contributes only marginally to a level reduction in the receiver in the almost direct coupling (when a hand grips the remote control device completely) of transmission electrode SE and reception electrode EE through a human hand.

FIG. 3 shows on the basis of a principle-sketch the coupling of the transmission electrode SE and the reception electrode EE.

The alternating electric field radiated on the transmission electrode SE is coupled in the finger. However, a part of the alternating electric field of the transmission electrode SE is also coupled in the reception electrode EE. The alternating electric field radiated on the compensation electrode KE (as indicated with dashed arrows) is also partially coupled in the human finger and partially in the reception electrode EE.

The influence of the alternating electric field of compensation electrode KE on the alternating electric field of the transmission electrode SE outside the fingers is preserved. The alternating field radiated from the transmission electrode SE, which operates directly on the reception electrode EE, experiences through the alternating field of the compensation electrode KE an actual level reduction.

The influence of the alternating electric field of compensation electrode KE on the alternating electric field of the transmission electrode SE in the finger is instead smaller, which leads to an actual increase of the current at reception electrode EE. This can be achieved for example, as the transmission electrode SE and the compensation electrode KE are laid out in such a way, that the electric field strength at the compensation electrode KE is smaller than the electric field strength at transmission electrode SE. Thus, a coupling between the transmission electrode SE and the reception electrode EE is produced through the finger, which withdraws at least partially from the influence sphere of the compensation electrode.

With reference to FIG. 10 the coupling of the transmission electrode SE and the reception electrode EE as well as the influence of the alternating electric field of the compensation electrode KE on this coupling is explained once more with the example of a computer mouse.

In a further embodiment the compensation electrode can also be used to determine the characteristics of the E-field surrounding the remote control device, in order to perform self-adjustment of the system.

FIG. 4 shows an asymmetric arrangement of the electrodes at the bottom of a remote control device. In this way a right/left-distinction of an approach to a remote control device can be performed. A time course of the current at reception electrode EE according to the approach direction is shown in the FIG. 4 chart, in which the characteristic curve C1 represents a right approach and the characteristic curve C2 a left approach. In this way a right-handed approach can also be easily distinguished from a left-handed approach.

FIG. 5 shows an alternative arrangement of the electrodes at the bottom of a remote control device. At least three electrodes SE, KE and EE are introduced in the troughs of the ribs, provided for the single fingers in a device wall. Thereby by means of the current path generated in the hand from the transmission electrode SE to the reception electrode EE the alternating electric field of compensation electrode KE is bypassed.

According to the invention there several transmission electrodes SE, reception electrodes EE and compensation electrodes KE can also be provided on a remote control device or on any other electric hand-held device, for example a computer mouse. Arrangement alternatives of the electrodes into a computer mouse are shown from FIG. 13a to FIG. 13j.

According to the invention several electrode structures can be also arranged on a hand-held device, in which each of the electrode structures has a transmission electrode, a reception electrode and a compensation electrode. Each of the electrode structures is preferably laid out in such a way that, with each of the electrode structures a detection of an approach or contact to the hand-held device according to the above principle is possible.

An example of a hand-held device with two electrode structures is shown in FIG. 6. FIG. 6 shows an input device 100, representative of other hand-held devices, for a game console. The input device 100 has two proximity or contact sensitive areas 110 and 120. In these areas below the casing surface one of the above-mentioned electrode structures is arranged. The electrode structures are not shown in FIG. 6. The electrode arrangement of an electrode structure on the input device can be for example chosen in such a way as shown with reference to FIG. 1.

Both sensitive electrode structures associated with the areas 110 and 120 are coupled with an evaluation electronic device, which is not shown here. The can retrieve the approach to an electrode structure in succession. For this purpose, the electronic evaluation device can be coupled for example with a multiplexer on the electrode structures.

Alternatively an electronic evaluation device can be provided for each of the electrode structures.

With both electrode structures it can be now distinguished, where the input device 100 is touched. According to which area 110, 120 is touched or which area a hand or both hands of a user is/are approaching, the electronic evaluation device can activate or perform different functions of the input device.

FIG. 7 shows three examples for the detection of an approach to an hand-held device and/or the contact of a hand-held device with several electrode structures. A so-called "Game-Controller" 100 is here shown as an example, which, as already shown in FIG. 6, has two proximity or contact sensitive zones 110 and 120. The Game-Controller 100 can be used here e.g. as a golf club for a golf game, played with a game console. A golf club for a golf game must be held with both hands, so that contact only with the sensitive area 110 (left illustration in FIG. 7) or only with sensitive area 120 (middle illustration in FIG. 7) does not determine any function in the golf club, or ignores the game console movements of the Game-Controller 100. Alternatively the Game-Controller 100 can indicate the user that the Game-Controller 100 needs to be held with both hands (right drawing in FIG. 7), to be used as golf club.

Such a function is not only limited to Game-Controller, but can be provided on various hand-held devices, for example a mobile phone or a MP3-player.

Likewise more than two electrode structures shown in FIG. 6 and FIG. 7 can be provided. So with three electrode structures three sensitive areas separated from each other can be arranged on a hand-held device for example, as for example a Game-Controller.

A combination with other sensor data, which are determined through appropriate means in or on the hand-held device, is also possible. So the shaking of a MP3-player, which can for example be detected through positioning sensors or acceleration sensors 130 as shown in FIG. 6, can cause different actions, depending on where the MP3-player is held. If the MP3-player is held in the area of a keyboard, the shaking can cause a change in the order of the music tracks, whereas holding it on the display during shaking determined a random selection of another music track.

The invention on the basis of a computer mouse is explained below.

As illustrated in FIG. 8 the solution according to the invention lies in the particular combination of three main modules.

The first main module comprises three E-field electrodes for the detection of an approaching human hand.

The second main module accomplishes an analogue signal processing of the signals delivered form the first main module.

The third main module is performed as a signal control unit (MCU) and conduces the signal control of the two aforementioned main modules and delivers the information obtained from the E-field to a connected external hardware.

The single modules are now described with more details.

A) the first main module—the e-field electrodes:

A particularly advantageous arrangement of the electrodes is illustrated in FIG. 9. On the upper side of a computer mouse three E-field electrodes SE, KE, EE are placed. The wider electrode SE (=transmission electrode) is supplied with a switching signal, which can have a frequency between 50 KHz and 300 KHz and a signal amplitude that should not exceed 20V value. The electrode KE (=compensation electrode), which may need a smaller surface than the electrode SE, is also supplied with the electric signal form of the electrode SE. The difference of the electric signals representing a detection feature between the electrode SE and the electrode KE is a phase difference from −140° to +140°. Moreover a signal amplitude difference between both the electrodes can be also advantageous for the desired, where necessary also spatially-directed, detection performances of the electrode arrangement.

The electrode EE (=receiver electrode) is connected to the signal input in the downstream analogue signal processing.

In FIG. 10 the interaction of this arrangement is further illustrated. The three electrodes on the computer mouse are construed in such a way that upon sufficient withdrawal or complete absence of a hand, the influencing E-field at the electrode EE, through the emitted E-field of the electrode SE with the help of the phase-delayed emitted E-field of the electrode KE, is extinguished. If a human hand approaches a computer mouse below a minimum distance, a new current path through the hand from the electrode SE to the electrode EE is generated, which withdraws the influence sphere of the electrode KE and leads to a significant current rise at the electrode EE.

B) the second main module—the analogue signal processing:

In FIG. 11 a preference circuit structure of an analogue signal processing for a cordless computer mouse is illustrated. The wiring of T1 is construed in such a way, that on one hand the impedance at the signal input of the module in the working frequency range reaches a minimum, and on the other hand the signal amplification, with the help of each component and its smallest possible steepness, experiences a stable operational maximum.

The following signal reinforcements of T2 as well as the output impedance of this component are construed in such a way, with the aid of D1, in order to obtain at the signal exit of the module a directly deduced DC-signal of the AC-signal of the signal input of the module as quickly as possible and with no need of a high energy supply.

C) the third main module—the signal control unit (MCU):

In FIG. 12 a particularly advantageous embodiment of a signal control unit for a cordless computer mouse is illustrated. The signal control unit consists of a central MCU. The signal processing process processed through this module can include the following possible functions:

- the MCU generates, with the help of its timers, periodically timing slots, e.g. 1 ms, in which the performing tasks of all three modules are worked out (=active phase); these timing slots can be expanded or shortened if necessary. FIG. 12 also shows, that the MCU further provides the remaining time intervals, e.g. 100 ms, a minimal current need of all three modules (=resting phase); these intervals can be arbitrarily expanded or shortened e.g. through changes of the registered quantities in the active phase.
- the MCU supplies in the active phase the analogue signal processing with energy supply, with the help of its supply switches only for the shortest necessary time lapse.
- the MCU generates in the active phase for a predefined time lapse the required switching signals for both E-field electrodes SE and KE; this lapse can arbitrarily be expanded or shortened.
- the MCU measures its actual operating voltage with the help of its A/D-converter inside the active phase and includes this/those measurement(s) into the successive result calculations.
- the MCU detects the alternating voltage-/pulsating voltage quantity in the active phase with the help of its ND-converter to fixed predefined points of time, which have generated the analogue signal processing, at their signal input, or at their signal imputs.

the MCU evaluates in the active phase, with the help of the CPU, REM, flash and the algorithms included in its firmware, all measurements, draws logical conclusions and determines the following performing actions of all modules involved.

the MCU optionally transmits in the active phase its information to a connected external hardware, e.g. a Wake-Up signal, with the help of its serial and/or parallel interface module.

the MCU optionally waits in the active phase for an answer/signal from a connected external hardware, e.g. a Go-To-Sleep-signal, when an external routine has been processed.

the MCU itself shifts at the end of the active phase into a sleep-mode (=low-power-mode), from which it can revert independently and/or through an external electrical signal.

The concept according to the invention leads to an increase in the lifetime of employed energy storage systems, e.g. batteries, through the combination of "the look into the future" with the help of the detection performed by means of E-fields of an approaching person, and the optimized interaction of a specifically adapted analog-front-end together with all process controlling MCU, as well as to a reduction/elimination of the "perceived" reaction time by a user, using e.g. a computer mouse with this technology. Loss of the "perceived" reaction time can be approximately reached through the above-described first threshold value I0, at which the computer mouse shifts from the sleeping mode into a waking-up mode.

As for its geometric construction and arrangement at the computer mouse the electrodes can also be differently arranged relatively to the above described embodiments.

Several possible variants of an electrode arrangement on a computer mouse are shown below. These different electrode arrangements can also be provided in other hand-held devices.

Figure 13A:
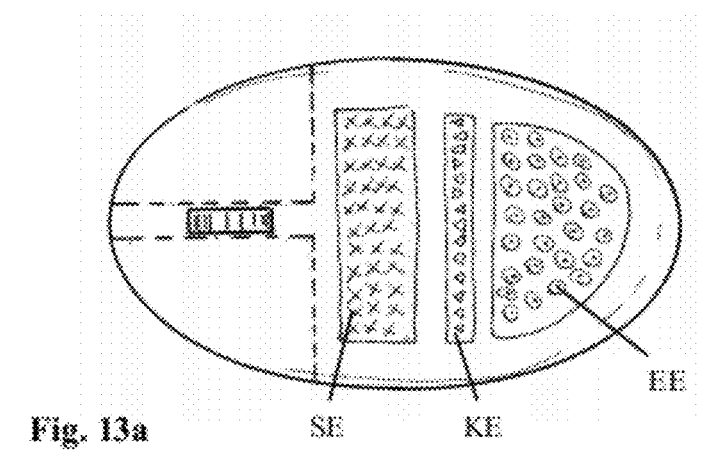
FIG. 13a shows an axisymmetric arrangement, in which the transmission and the reception electrodes are turned 180°.
Figure 13B:
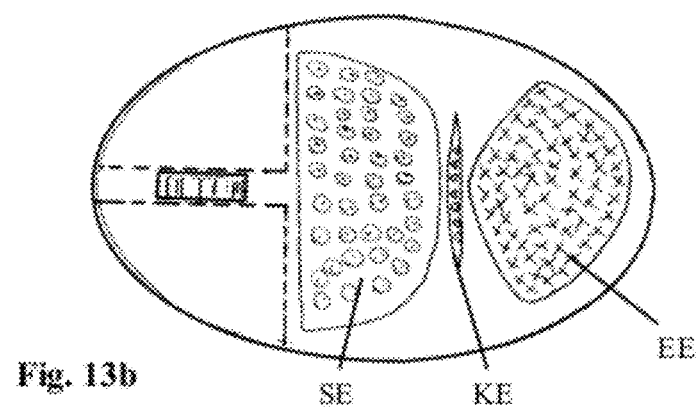
FIG. 13b shows an axisymmetric arrangement, optimized as for its detection range.
Figure 13C:
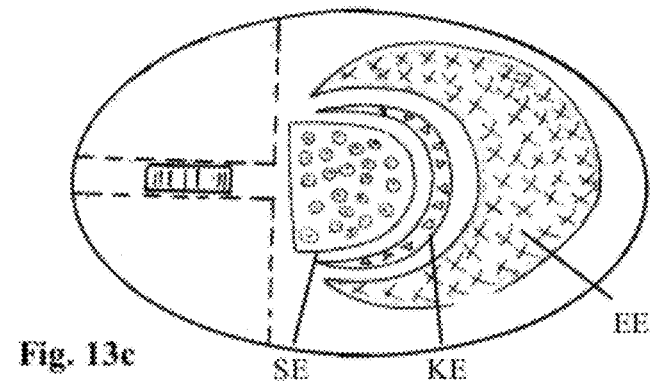
FIG. 13c shows a half-rotationally symmetrical arrangement of all electrodes.
Figure 13D:
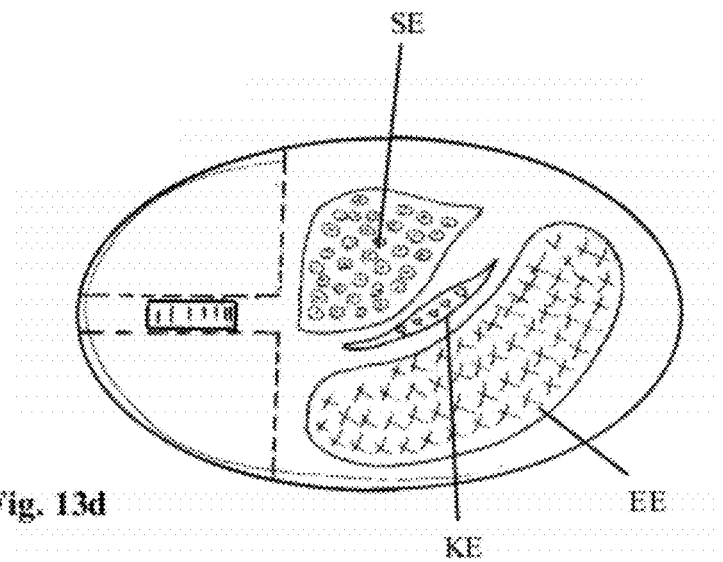
FIG. 13d shows an arbitrarily turned arrangement, here about 45°, of all electrodes.
Figure 13E:
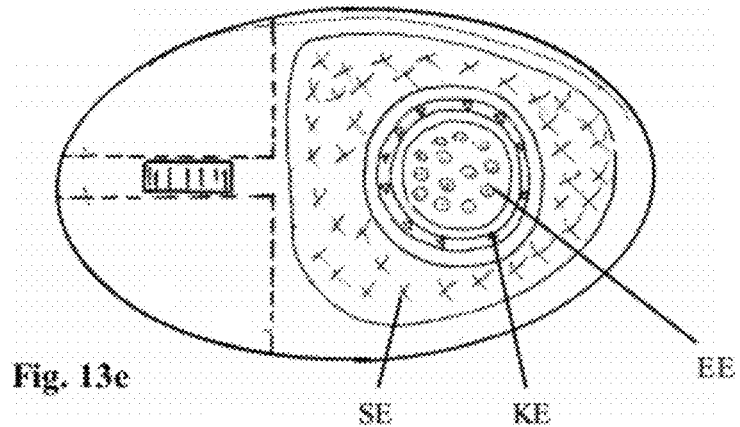
FIG. 13e shows a fully-rotationally symmetrical arrangement of all electrodes.
Figure 13F:
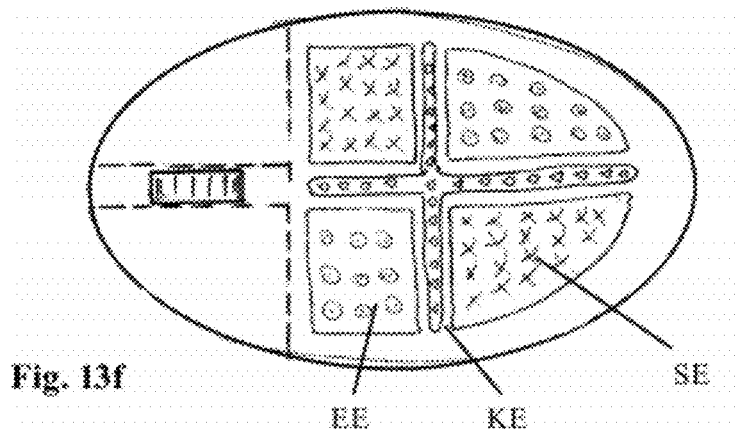

FIG. 13f shows a multi-split transmission electrode SE and receiver electrode EE in point-symmetric arrangement. Through this construction the detection of gestures is especially possible in an advantageous way. An e.g. top right approach differs from a bottom left approach in that, the currents in the respective reception electrodes are (clearly) different.

Figure 13G:
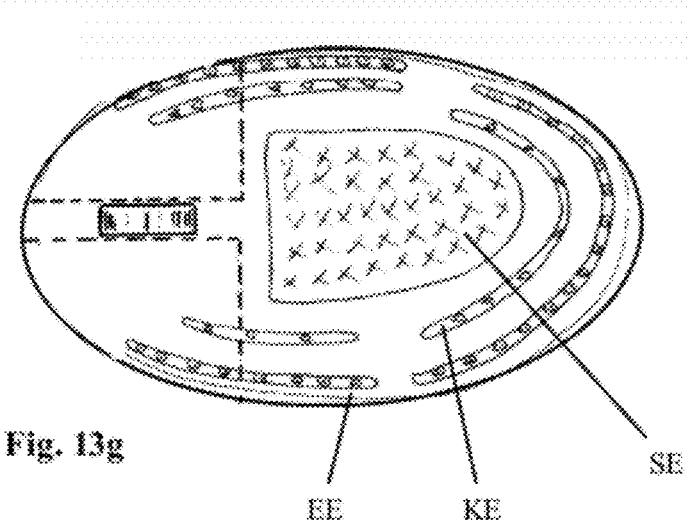

FIG. 13g shows a multi-split lateral reception electrode EE in point-, axis-, or asymmetric arrangement. Through this construction the detection of gestures is also possible in an advantageous way. The approach direction can be detected as well, since according to the approaching direction in the reception electrodes EE the currents are each time different. Sideways transmission electrodes SE can also be applied.

FIG. 13h shows a multi-split receiving electrode in a fully-rotationally symmetrical arrangement. Thereby a detection of gestures as well as of approaching direction is possible.

FIG. 13i shows a multi-fragmented transmission electrode in a double axisymmetric arrangement. The detection of gestures is here possible.

FIG. 13j shows a fun design with the help of electrodes, which can contain axis- or point-symmetries of some/all electrodes or be completely asymmetric as well. The detection of gestures is here possible.

Alternatively to performance of the E-field electrodes as correspondingly formed and inserted, or made of metallic surfaced sections electrode components, it is also possible to develop them using one single or additional plastic material and/or casing material in and/or below the surface of the overall device/operating area.

Figure 14:
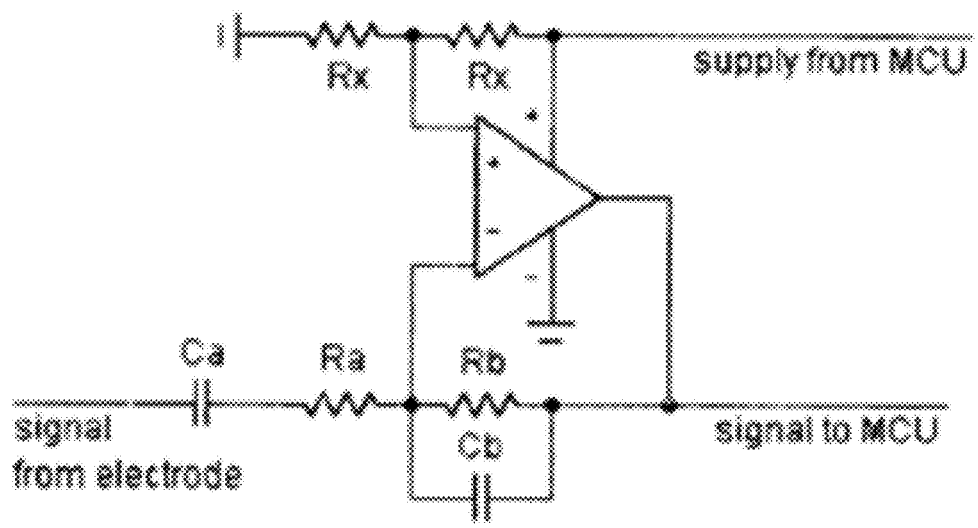

Moreover it is also possible to implement the circuit with the construction shown in FIG. 14. In case of a circuit design shown in FIG. 14 the analogue signal processing is made with the help of a computing amplifier, which is wired up in a form, so that at its signal exit a copy of reception electrode current is generated (here an arrangement without a downstream DC-rectification). Ca, Ra, Cb and Rx components are optionally necessary, for Rb a discrete or indirect form of its realization is recommended. Moreover it is possible to quit the A/D-converter in the signal control unit and instead to process the further logic actions on the basis of the results of one or several comparators.

Figure 15:
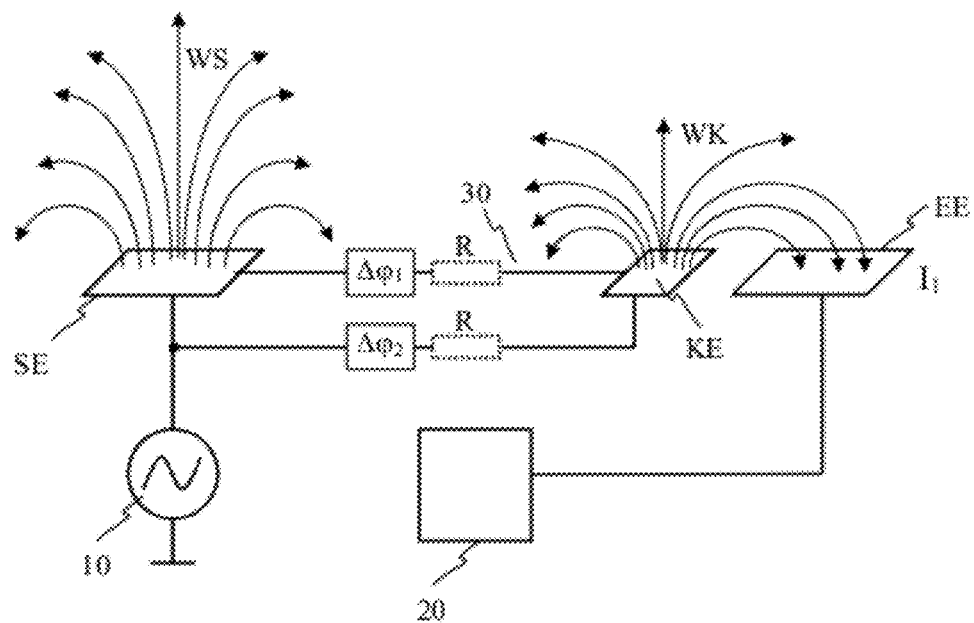

FIG. 15 shows a block diagram of a detection device according to the invention for an electric hand-held device.

The detection device substantially consists of a transmission electrode SE, a compensation electrode KE, a reception electrode EE, a signal generator 10, as well as a evaluation electronics 20.

The transmission electrode SE and the compensation electrode KE are supplied and/or impressed with an alternating electric voltage, which is supplied by the generator 10. Thereby alternating electric fields WS and WK are formed on the transmission electrode SE and on the compensation electrode KE, respectively. The alternating electric voltage, which is supplied by the generator 10, has a frequency of about 50 KHz and 300 KHz. Preferably the alternating voltage has a frequency between 75 KHz and 150 KHz.

The transmission electrode SE and the compensation electrode KE are arranged on the hand-held device in such a way that the alternating electric field irradiated on the transmission electrode SE is not coupled to the compensation electrode KE or to the reception electrode EE. In order to prevent a coupling of the alternating electric field WS to the compensation electrode KE or to the reception electrode EE, the electrode geometry of the transmission electrode or the compensation electrode KE and/or the reception electrode EE can be accordingly adjusted.

According to the invention the transmission electrode SE is galvanically coupled to the compensation electrode KE by the connection 30 between the two electrodes SE and KE, as shown in FIG. 15. So the alternating electric voltage impressed on the transmission electrode is impressed also on the compensation electrode KE. The galvanic coupling of the transmission electrode SE to the compensation electrode KE may occur by means of an ohmic resistance R, which dampens the alternating electric voltage supplied on the transmission electrode SE. The compensation electrode KE is coupled also by means of an ohmic resistance R to the signal generator 10. Also in this case the ohmic resistance causes a signal damping of the alternating electric voltage supplied by the signal generator 10.

Moreover the coupling of the signal generator 10 to the compensation electrode KE is done by means of a phase shifter $\Delta\phi_2$, which shifts the phase of the alternating voltage which supplies the compensation electrode KE towards the phase of the alternating voltage, which supplies the transmission electrode SE. Thereby it can be achieved that the compensation electrode KE is supplied with two alternating voltages, whose signal form is substantially identical, which however are phase-delayed one relative to the other. The alternating electric field WK irradiated on the compensation electrode KE results from the superposition of the two alternating voltages, which are phase-delayed one relative to the other, by which the compensation electrode KE is supplied.

The coupling of the transmission electrode SE to the compensation electrode KE may occur also by means of a phase shifter $\Delta\phi_1$. The phase shifters $\Delta\phi_1$ and $\Delta\phi_2$ may be arranged as adjustable phase shifters.

In a specific embodiment only one of the two phase-shifters $\Delta\phi_1$ or $\Delta\phi_2$ is required, in order to guarantee, that the two alternating voltages, through which the compensation electrode KE is supplied, are phase-delayed one relative to the other. However the use of both phase shifters $\Delta\phi_1$ and $\Delta\phi_2$ has the advantage that more freedom of choice is allowed for setting the phase difference between the two alternating voltages.

The reception electrode EE is arranged relative to the compensation electrode KE in such a way that the alternating electric field WK irradiated on the compensation electrode KE can be coupled on the reception electrode EE. Moreover the reception electrode is not coupled to the compensation electrode KE.

The alternating electric field WK coupled on the reception electrode EE of the compensation electrode KE generates a current on the reception electrode EE. The current $I_1$ generated by the alternating electric field WK coupled on the reception electrode defines a level, on which a switch of the hand-held device from a sleeping mode to an active mode can be done. The current generated on the reception electrode EE can be supervised and/or evaluated by means of an evaluation electronics 20, which is coupled with the reception electrode EE.

The current $I_1$ on the reception electrode EE or the level at which a mode switch of the hand-held device is done, can be set by changing the phase shift between the alternating voltage with which the transmission electrode is supplied and the alternating voltage with which the compensation electrode is supplied. The phase shift between the two alternating voltages can be accomplished either with the phase shifter $\Delta\phi_1$ or with the phase shifter 42. Therefore it is sufficient also to provide only one of the two phase-shifters. For certain applications it may be advantageous also to provide, instead of an adjustable, also a non-adjustable phase shifter, for example a RC element.

The distance between the transmission electrode SE and the compensation electrode KE and/or the alternating voltage, with which the transmission electrode SE is supplied, are selected in such a way, that the alternating electric field irradiated on the transmission electrode SE does not couple to the compensation electrode KE. Only in this way it can be guaranteed that the current $I_1$ generated on the reception electrode EE without grip by a hand, does not rise above a predetermined value, which would cause a switch of the hand-held device in an active mode.

Figure 16:
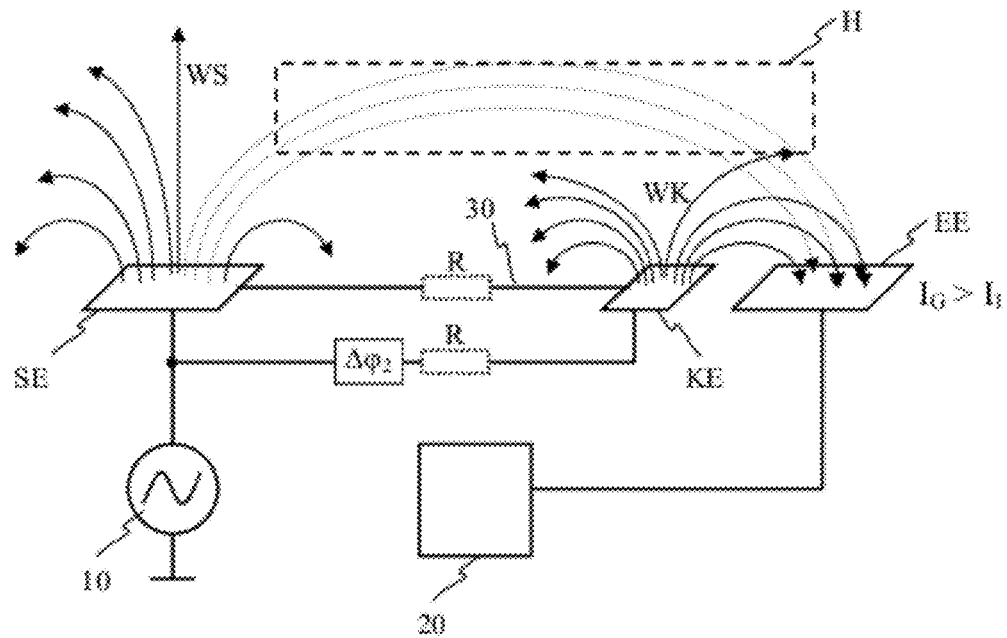

FIG. 16 shows the block diagram of a detection device according to the invention of FIG. 15, wherein a hand H allows a coupling of the alternating electric field irradiated on the transmission electrode SE to the reception electrode EE. The detection device is itself substantially identical to the detection device according to FIG. 15. The detection device in FIG. 16 has only a phase shifter $\Delta\phi_2$, by means of which the signal generator 10 is coupled to the compensation electrode KE. With the phase shifter $\Delta\phi_2$ it is allowed, that the signal on the compensation electrode KE is phase-delayed relative to the signal on the transmission electrode SE.

A hand H approaching the transmission electrode SE and the reception electrode EE or a hand H touching both these electrodes will entail that the electric alternating field WS irradiated on the transmission electrode is coupled by the hand H to the reception electrode EE. The alternating electric field WS coupled on the reception electrode EE generates a second current $I_2$ in the reception electrode EE. The total current $I_G$ resulting from the current $I_1$ and the current $I_2$ or the change of the total current can be detected by the evaluation electronics 20. The total current $I_G$ or the current change can be led to a control device (not shown in FIG. 16), which may cause a predetermined action by means of the current $I_G$ or a current change in a hand-held device. This predetermined action may be for example the shift of the hand-held device from a sleeping mode into an active mode.

In this way also different threshold values can be defined. For example a first threshold value can be defined, which is higher than the current $I_1$. When exceeding this threshold value or when the current exceeds this threshold value on the reception electrode EE, the hand-held device can be shifted from a sleeping mode into an awake mode. A second threshold value, which is higher than the first threshold, can be provided, in order to shift the hand-held device from an awake mode into an active mode.

The different switching thresholds or currents in the reception electrode EE can be reached in that, shortly before gripping the hand-held device with a hand, a current, higher than the current of the first threshold however smaller than the current of the second threshold, already flows in the reception electrode by means of the coupling effect of the hand. If in the end the hand grips the hand-held device completely, the capacitive coupling performed by means of the hand between the transmission electrode and the reception electrode is so ample, that the electrical alternating field WS coupled by means of the hand H on the reception electrode EE is sufficient for the transmission electrode SE to increase the total current flowing in the reception electrode EE above the second threshold.

The threshold or thresholds can be deposited as absolute threshold values or as relative threshold values with respect to the current $I_1$ in the evaluation electronics 20 or in a control device.

Figure 17:
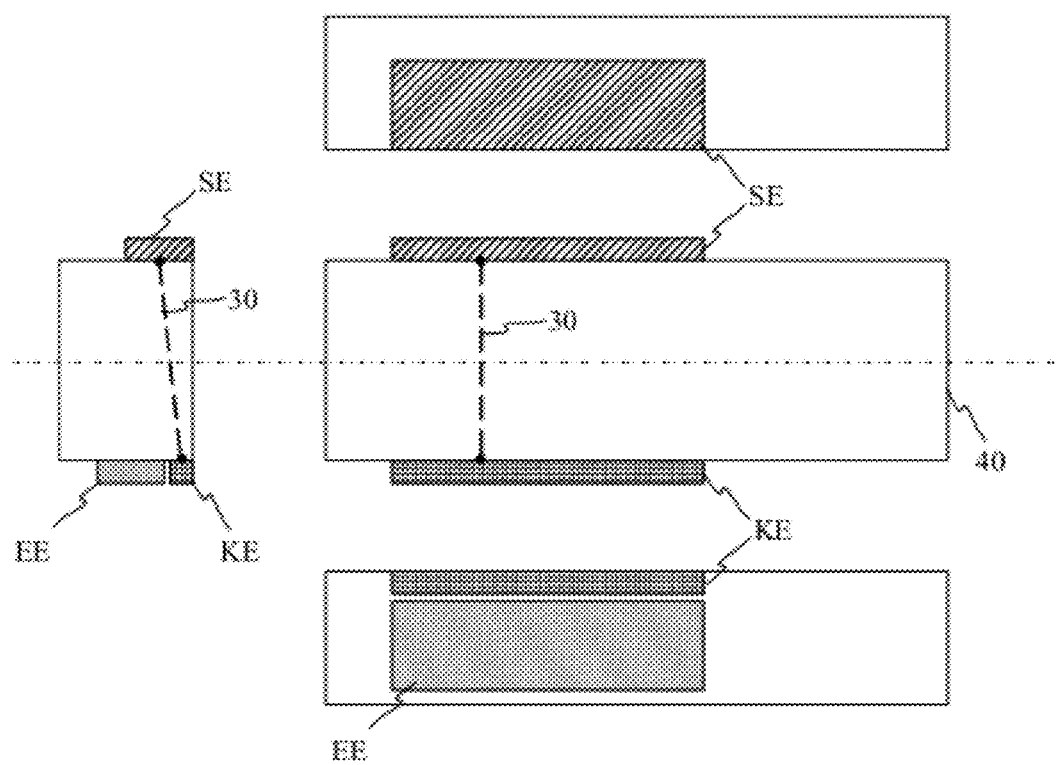

FIG. 17 shows a hand-held device 40, with a preferred embodiment concerning the arrangement of the electrodes on the hand-held device 40. FIG. 17 shows a bottom view, a front view as well as a correspondent side view of the hand-held device 40.

The transmission electrode SE is arranged on a first sidewall 41. The reception electrode EE and the compensation electrode KE are arranged on the second sidewall 42, opposite the first sidewall 41.

As FIG. 17 shows, the compensation electrode KE and the reception electrode EE are galvanically separated from each other. Furthermore, it also shows that the transmission electrode SE and the compensation electrode KE are galvanically coupled with each other according to the invention.

All electrodes can, as shown in FIG. 17, be arranged on the surface of the hand-held device 40. In another embodiment, not shown here, all electrodes or some of them can also be directly arranged below the surface of the hand-held device 40, which, as for the embodiment of the detection arrangement according to the invention, has only the effect that either the signal, with which the transmission electrode SE and/or the compensation electrode KE are actuated, or the phase shifter $\Delta\phi_1$ and/or $\Delta\phi_2$ must be adapted accordingly.

Apart from that, an arrangement of the electrodes directly below the surface of the electric hand-held device 40 has no effects on the operation of the detection device, since the detection of the gripping by a hand occurs on the basis of electrical field interactions between the electrodes. However, the arrangement of the electrodes directly below the surface of the hand-held device 40 has the advantage that the electrodes are protected from external influences.

The electrodes are here arranged in such a way that when the hand-held device 40 is placed on an electrically conductive surface, they do not touch the surface. The distances between the electrodes and the surface, or the electrode surfaces, are selected in such a way, that the impedance between the transmission electrode SE and the reception electrode EE does not exceed a predetermined value. This guarantees that the electrical alternating field WS irradiated on the transmission electrode SE by the electrically conductive surface is not coupled into the reception electrode EE.

Thereby, the impedance between transmission electrode SE and reception electrode EE results from the impedance between transmission electrode and surface, the impedance of the surface and the impedance between surface and reception electrode. In this way, it is possible to guarantee that, even if the hand-held device 40 is placed on an electrical conductive surface, the current $I_1$ in the reception electrode EE does not exceed a specific first threshold value, producing for example a spontaneous activation of the hand-held device.

The electrodes may be arranged for example on the left and right side of a mobile phone, so that the mobile phone switches to an active mode when gripped. If the mobile phone is put down again and the user's hand moves away from the mobile phone, it switches to a sleeping mode automatically, since the current on the reception electrode EE decreases, thus falls again below the active mode threshold.

The electrode arrangement according to the invention or the detection arrangement according to the invention can be applied to all hand-operated devices, which substantially can be gripped with a hand in case of use. Therefore, even a computer mouse can be provided with the detection device according to the invention.

The electrode arrangement according to the invention or the detection device according to the invention can also be applied to objects having a handle, in which the three electrodes according to the invention can be arranged on the handle.

Several detection devices according to the invention can also be provided in a hand-held device, in order to even detect the position of the hand on the hand-held device during the gripping operation. Alternatively, several receiving electrodes EE can also be provided, being each able to be capacitively coupled with the compensation electrode and each able to be coupled with the evaluation unit 20. In this way, a switching of the hand-held device from a sleeping mode to an active mode can also be accomplished when a current exceeding a predetermined threshold flows in at least two receiving electrodes.

Of course, a detection arrangement may also be provided with one transmission electrode, several compensation electrodes and several receiving electrodes, wherein the compensation electrodes are all coupled with the signal generator by means of a phase shifter. Each phase shifter may cause a different phase shift between the alternating voltage applied to the transmission electrode and the alternating voltage applied to the compensation electrode. In this way, a current with a different level, each representing a switching threshold for the compensation electrode, flows in every reception electrode (if the hand-held device is not in use or not gripped with a hand).

The hand-held device may be for example a mobile phone or a computer mouse, in which after the gripping operation the mobile phone or the computer mouse switches from a sleeping mode to an active mode and, after hand removal, from the active mode to the sleeping mode.

Figure 18:
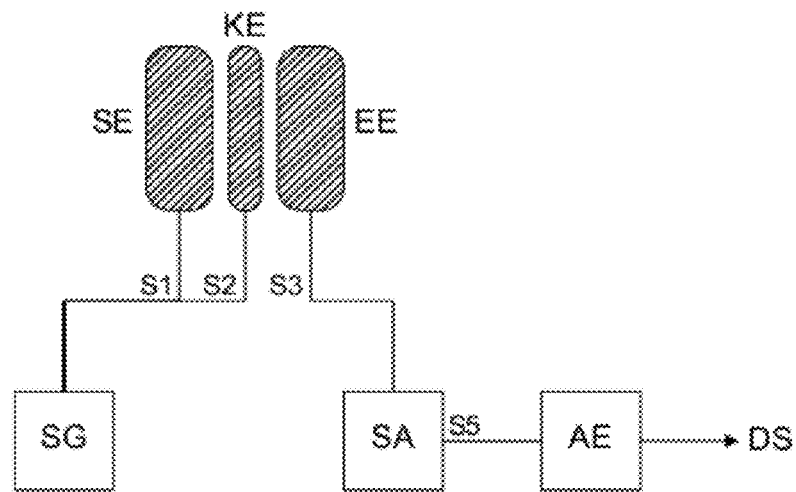

FIG. 18 shows a block diagram of a circuit arrangement according to the invention for generating an output signal DS which is indicative for the dielectric properties of an observation area of a capacitive sensor element.

The capacitive sensor element comprises a transmitting electrode SE, a compensation electrode KE and a receiving electrode EE. The transmitting electrode SE and the compensation electrode KE are each coupled with a signal generator device SG. The signal generator device SG is formed to charge the transmitting electrode SE with a first alternating electrical signal S1 and the compensation electrode KE with a second alternating electrical signal S2. The second alternating electrical signal S2 is preferably dephased to the first alternating electrical signal S1.

At both the transmitting electrode SE and the compensation electrode KE, an alternating electrical field is emitted, wherein the alternating electrical field radiated at the compensation electrode and the alternating field radiated at the transmitting electrode SE overlap. Both alternating electrical fields, i.e. the alternating electrical field resulting from the two alternating electrical fields, couples into the receiving electrode EE. The alternating electrical field coupled into the receiving electrode EE depends on the dielectric properties of the environment, i.e. the observation area which is defined by the electrodes SE, KE and EE. In the case of an object approaching the sensor element, for example a hand, part of the alternating electrical field radiated at the transmitting electrode SE is coupled into the receiving electrode EE via the hand and thus withdraws from the influence of the alternating electrical field radiated at the compensation electrode KE.

The electrical signal resulting from the alternating electrical field coupling into the receiving electrode EE also depends on the dielectric properties of the observation area. In the case of a hand approaching the capacitive sensor element, for example, the electric current flowing in the receiving electrode EE grows or diminishes. The receiving electrode EE is coupled with a signal processing device SA which is designed for processing an electrical electrode signal S3 measured at the receiving electrode and for providing a processed signal S5. At the receiving electrode EE, an electric current or a voltage may be measured.

The processed electrical signal S5 is conducted to an evaluator AE which evaluates the processed electrical signal S5 and provides the result of the evaluation as an output signal DS. The output signal DS is thus indicative for the dielectric properties of the observation area of the capacitive sensor element.

Figure 19:
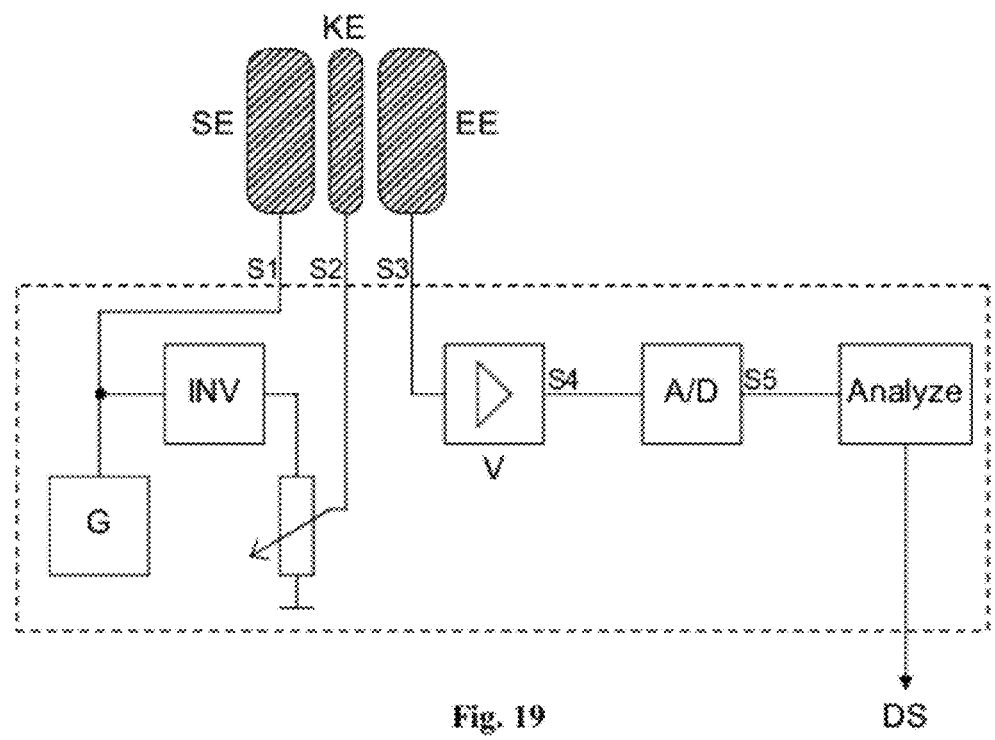

FIG. 19 depicts a concrete implementation example of a circuit arrangement according to the invention.

A signal generator G provides a first alternating electrical signal S1 which is charged at the transmitting electrode SE. This first alternating electrical signal S1, moreover, is conducted to an inverter INV, in order to generate an alternating electrical signal which is basically dephased by 180° to the alternating electrical signal S1 provided by the signal generator G. This inverted alternating electrical signal is charged by means of a voltage divider, for example a potentiometer, at the compensation electrode KE. The potentiometer is provided for attenuating the alternating electrical signal S2 charged at the compensation electrode, i.e. the inverted alternating electrical signal. As an alternative to the potentiometer, e.g., an amplifier with an amplification factor smaller than 1 can also be provided. Other circuit elements suitable for attenuating the inverted alternating electrical signal can also be used. The first alternating electrical signal can also be attenuated at first, before it is inverted. The alternating electrical signal charged at the compensation electrode KE is thus dephased by 180° to the alternating electrical signal charged at the transmitting electrode SE and moreover comprises a smaller amplitude than the alternating electrical signal S1 charged at the transmitting electrode.

The use of an inverter and an attenuator is especially advantageous if the circuit arrangement is designed as an integrated component, for example an ASIC (Application Specific Integrated Circuit).

At the receiving electrode EE, an electrode signal S3 is measured and conducted to an amplifying device V. The amplifying device V in this case is a current/voltage transformer with a downstream voltage amplifier. The amplifying device at its output provides a voltage S4 which is proportional to the electric current measured at the receiving electrode EE. Preferably, the voltage gain of the voltage amplifier is adjustable, so that the circuit arrangement according to the invention can be adapted easily to different capacitive sensor elements. This may be necessary, for example, if different sensor elements, each with different electrode geometries, and/or different electrode surfaces are to be connectable to the circuit arrangement.

In another embodiment not shown here, the current/voltage transformer may comprise a transimpedance amplifier, wherein preferably the transimpedance of the transimpedance amplifier is also adjustable.

In a still further embodiment not shown here, the amplifying device V can also be formed in such a way that the electric current measured at the receiving electrode EE is directly amplified and conducted to the subsequent evaluator.

The electrical signal S4 provided by the amplifying device V is conducted to a digitization device A/D which digitalizes the electrical signal S4 and provides a digitalized signal S5. The digitalized signal S5 is conducted to an evaluator which evaluates the digitalized signal and provides a detection signal DS as a result of the evaluation which is indicative for the dielectric properties of the observation area of the capacitive sensor element.

Figure 20:
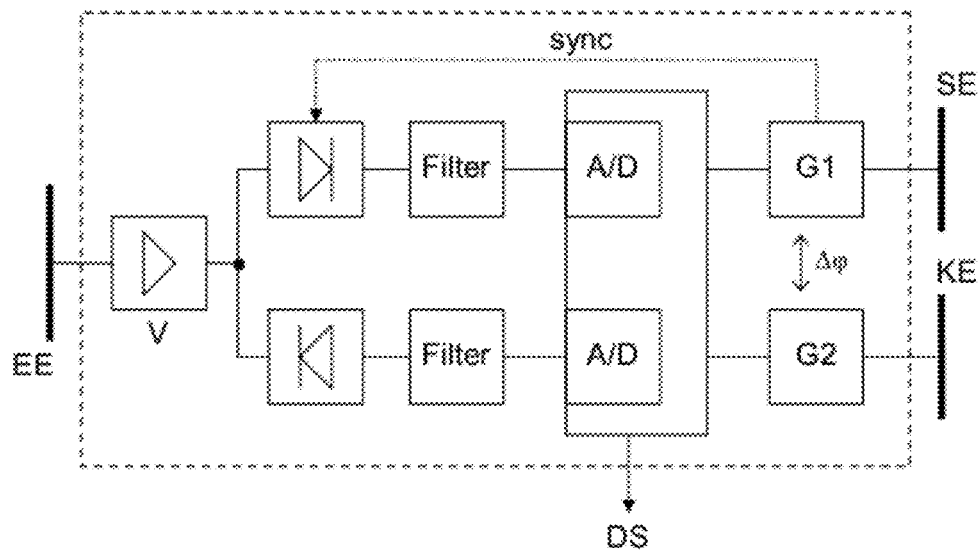

FIG. 20 shows another concrete implementation example of a circuit arrangement according to the invention. At the receiving electrode EE, an electrical signal is measured and conducted to an amplifying device V. The amplifying device V is here coupled with a first diode and a second diode, wherein the first diode is operated in the forward direction for the positive half waves and the second diode in the forward direction for the negative half waves of the electrical signal measured at the receiving electrode EE. The amplifying device V thus constitutes, together with the first diode and together with the second diode respectively, a single-wave rectifier.

Instead of the diodes shown here, electronically controlled switches can also be provided, which are opened and closed respectively synchronous to the first alternating electrical signal (signal of the generator G1), so that only the positive half waves and the negative half waves respectively of the electrical signal applied at the amplifying device V are each conducted to the subsequent filter.

The signals demodulated and smoothed by the filter are each conducted to an analog-digital converter A/D. The analog-digital converters A/D can be a component of a microcontroller µC. The digital signals provided by the analog-digital-converters A/D are evaluated by the microcontrollers µC in order to, for example, determine an approach of a hand to the sensor element and/or a grip of the handset by a hand. The result of the evaluation can be provided as a (digital) detector signal DS by the microcontroller µC for further processing in an electronic handset.

The microcontroller µC may also be provided in order to control the signal generators G1, G2 shown in FIG. 20. The signal generators G1 and G2 respectively each provide an alternating electrical signal, wherein the alternating electrical signal generated by the first signal generator G1 is charged at the transmitting electrode SE and the alternating electrical signal generated by the second signal generator G2 is charged at the compensation electrode KE. The alternating signals generated by the two signal generators G1, G2 are preferably dephased towards each other. Preferably, the alternating electrical signal generated by the signal generator G2 is dephased by 150° up to 180° with respect to the alternating electrical signal generated by the signal generator G1.

With a phase shift by nearly 180° a maximum attenuation of the alternating electrical field radiated at the transmitting electrode SE by the alternating electrical field radiated at the compensation electrode KE is reached. It is thus guaranteed that the alternating electrical field coupled in at the receiving electrode EE only generates a very small current, preferably almost no current, in the receiving electrode EE.

When a hand approaches the sensor element, the electrical alternating field radiated at the transmitting electrode SE is coupled at least partially via the hand into the receiving electrode EE, wherein the alternating electrical field coupled into the receiving electrode via the hand basically withdraws from the influence of the alternating electrical field radiated at the compensation electrode KE. This means that the part of the alternating electrical field radiated at the transmitting electrode SE at the alternating electrical field coupled into the receiving electrode EE increases due to the approaching hand. In this way, it is guaranteed that a hand approaching the sensor element leads to a significant current rise in the receiving electrode EE.

Preferably, the alternating electrical signal generated by the second signal generator G2 is attenuated before it is charged at the compensation electrode KE. This will allow the amplitude of the electrical signal provided by the second signal generator G2 to be smaller than the amplitude of the electrical signal provided by the first signal generator G1.

Figure 21:
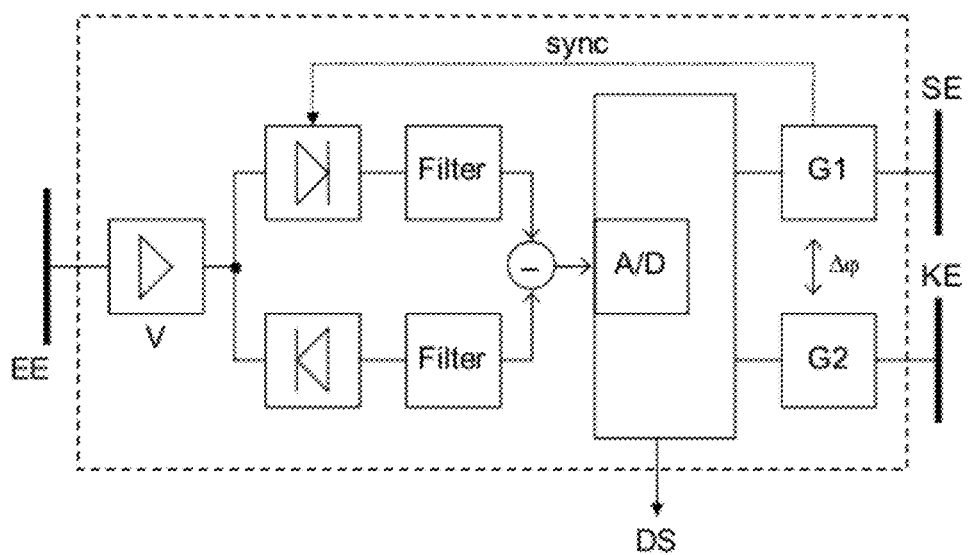

FIG. 21 shows a further implementation variant of a circuit arrangement according to the invention. The amplifying device V coupled with the receiving electrode EE as well as the diodes coupled with the amplifying device V with the respective downstream filters basically correspond as already shown with respect to FIG. 20.

Figure 1:
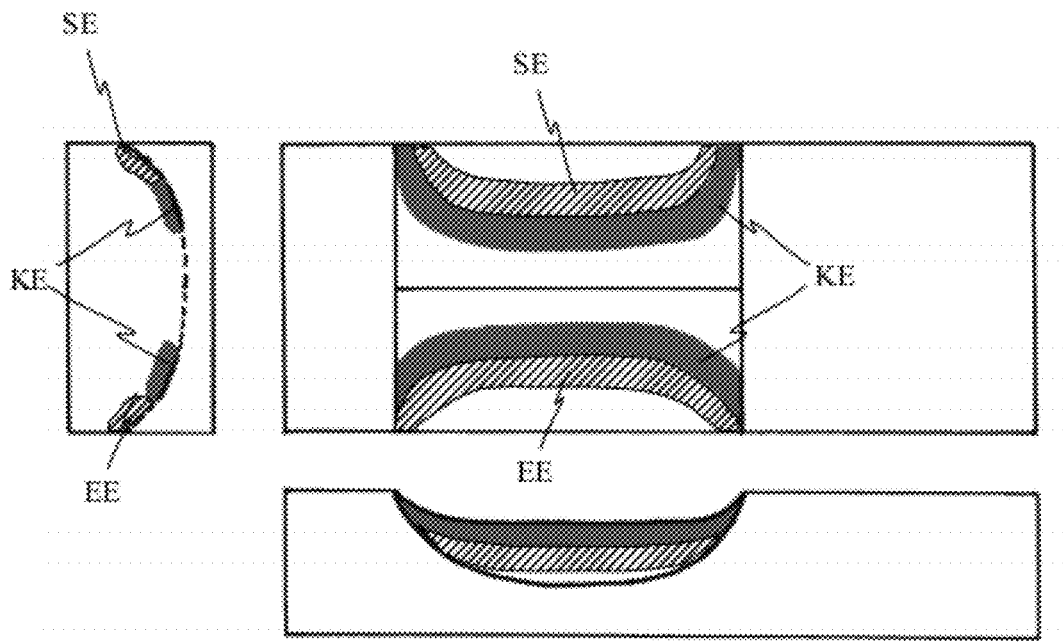
Figure 2A:
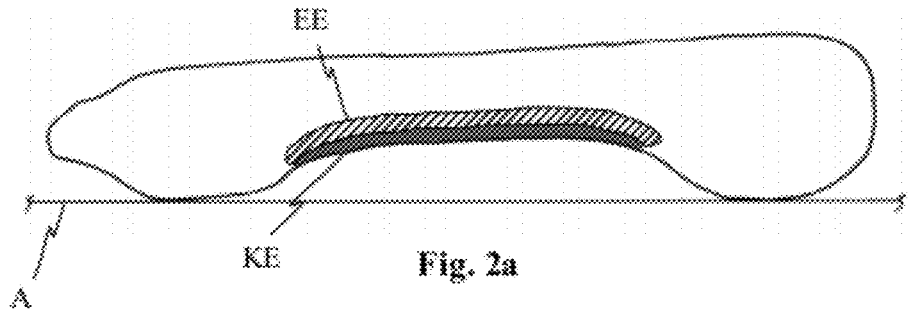
Figure 2B:
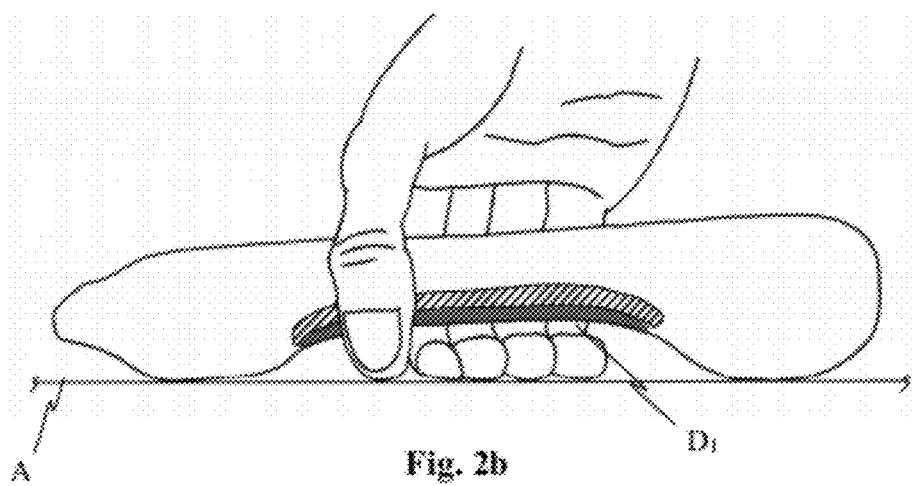
Figure 2C:
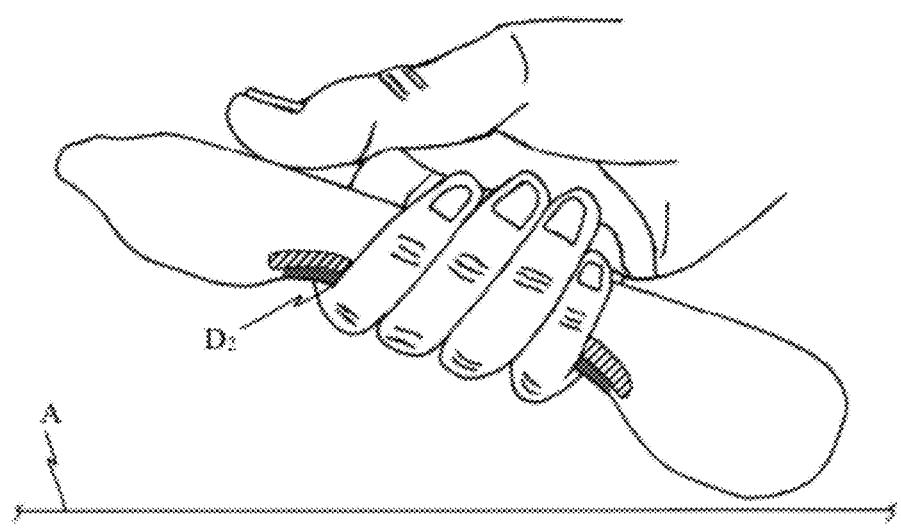
Figure 3:
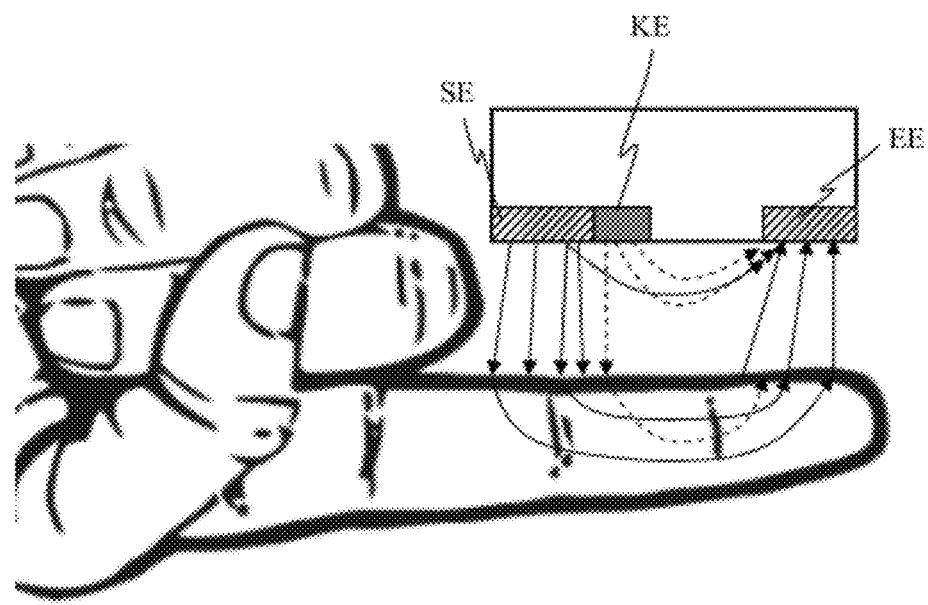
Figure 4:
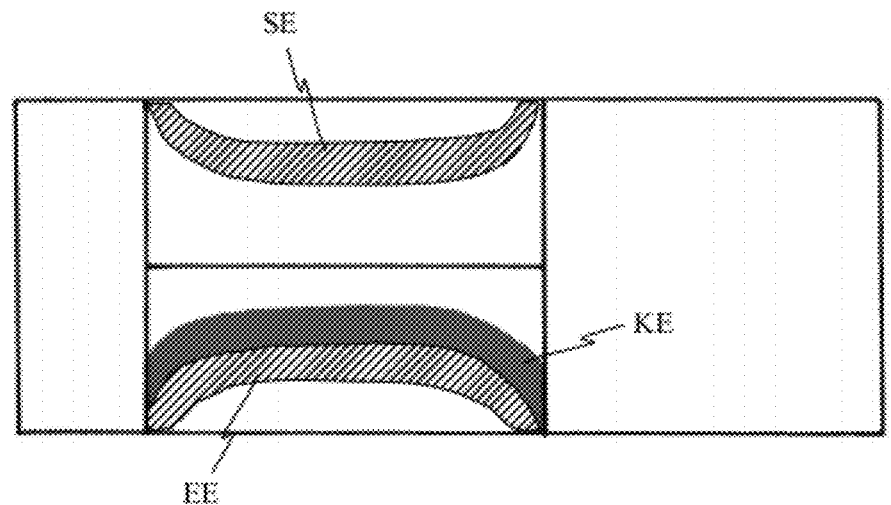
Figure 4:
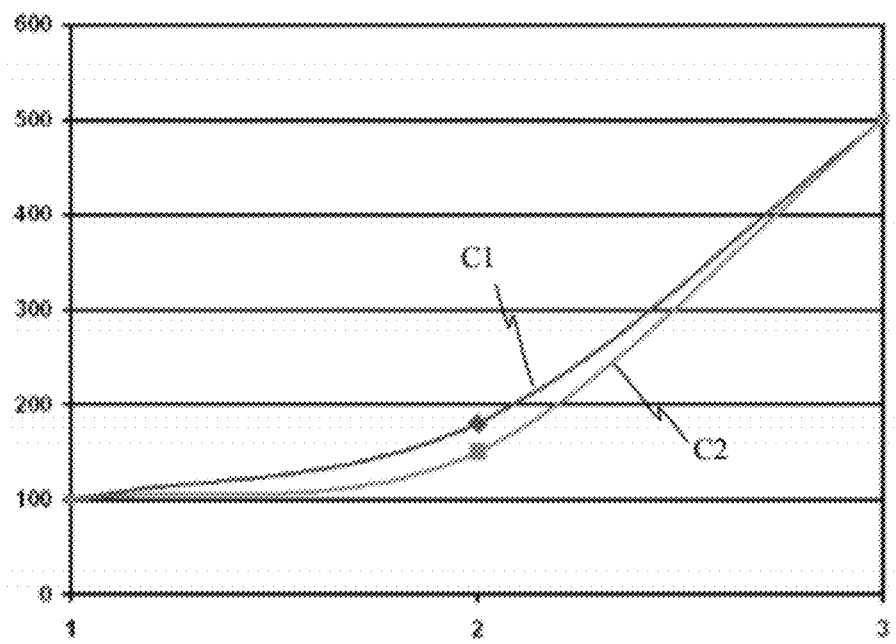
Figure 5:
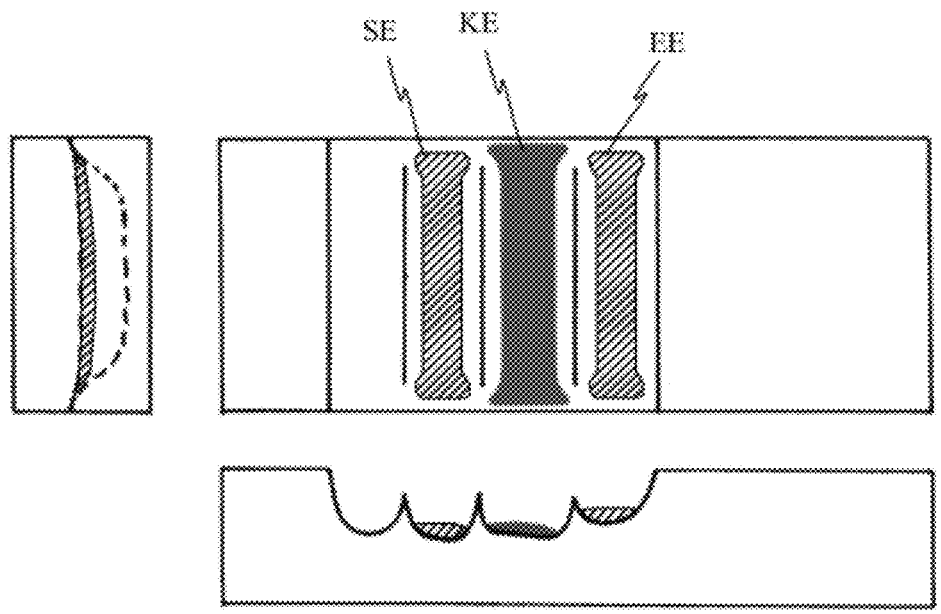
Figure 6:
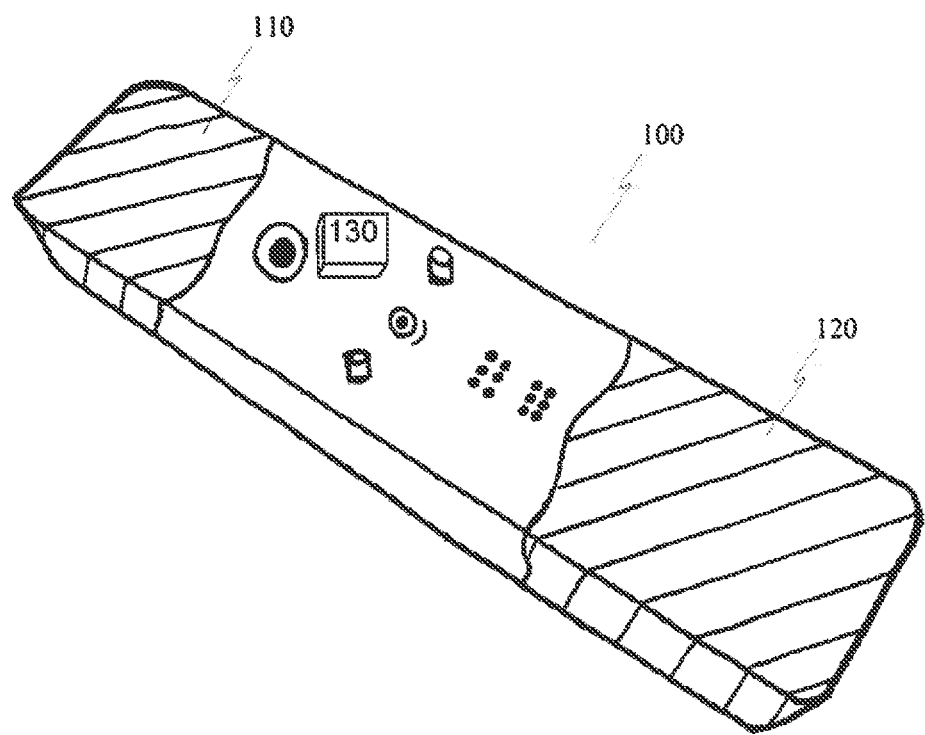
Figure 7:
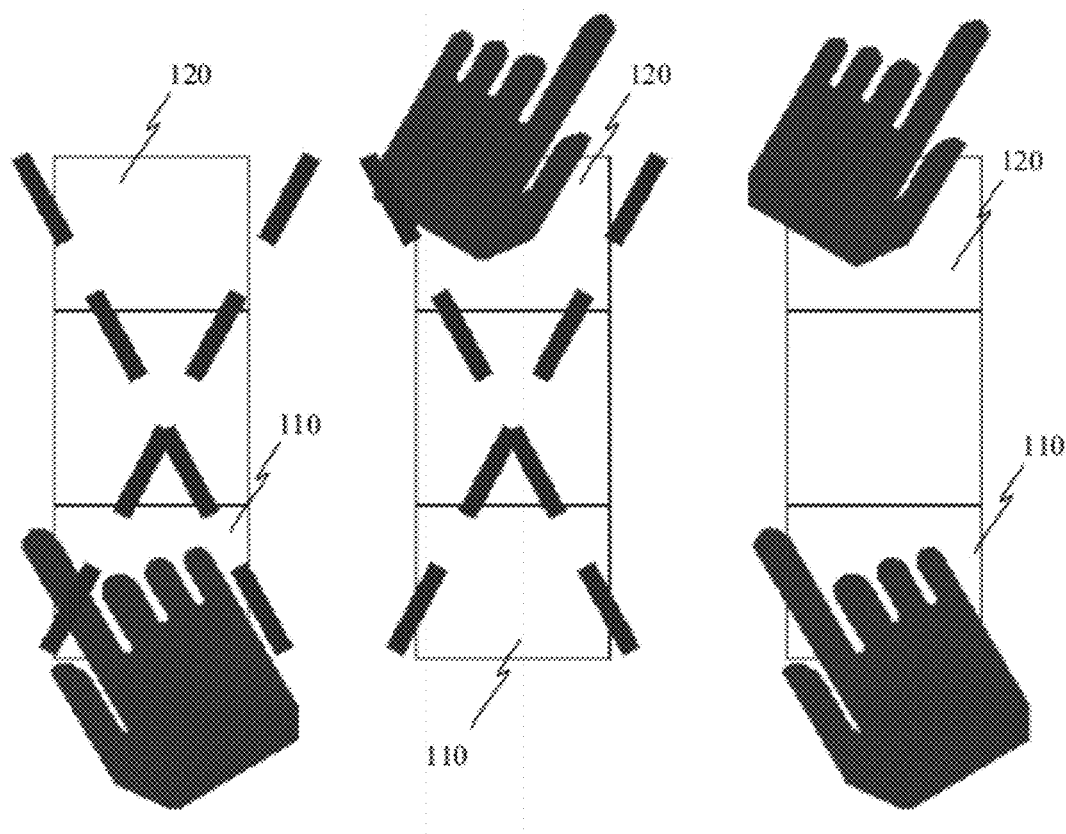
Figure 8:
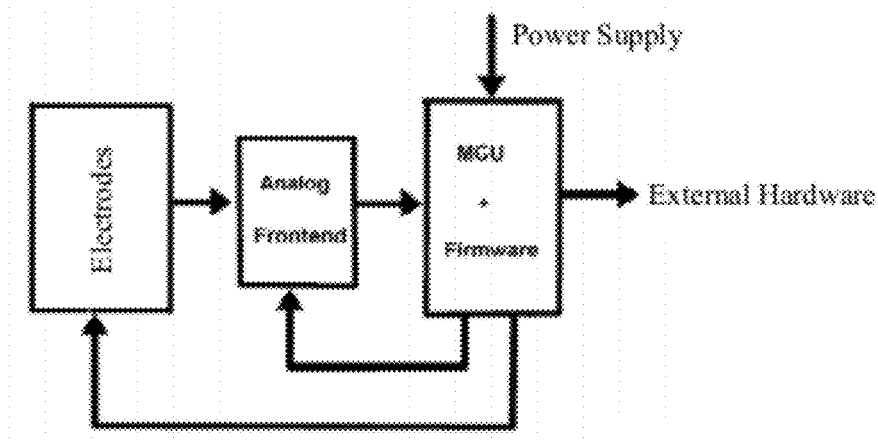
Figure 9:
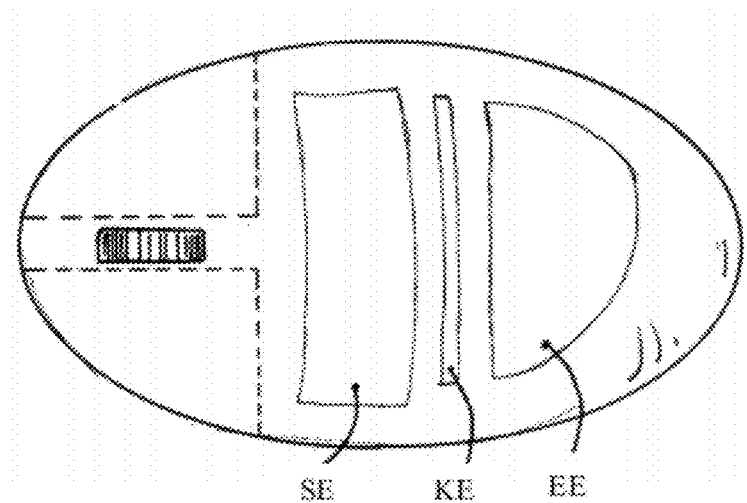
Figure 10:
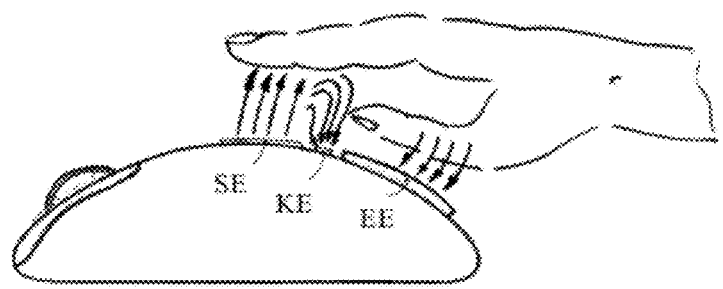
Figure 11:
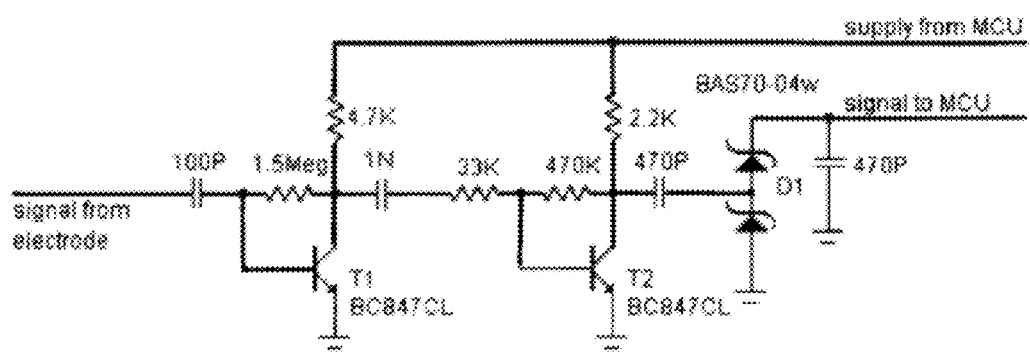
Figure 12:
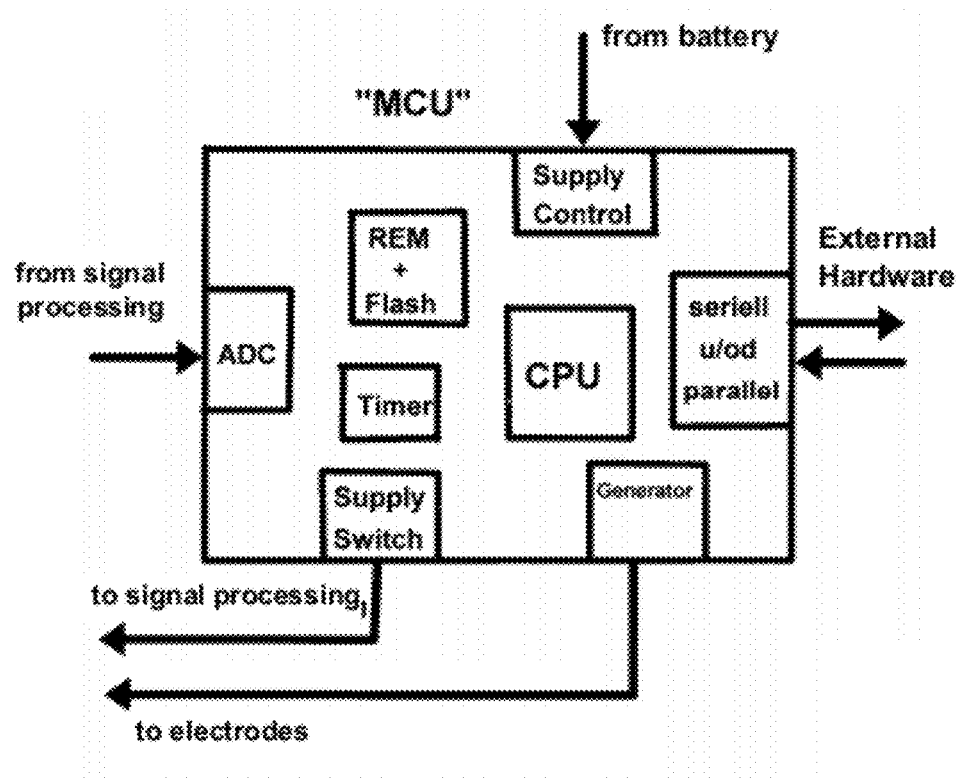

Unlike the embodiment shown in FIG. 3, the output signals applied at the filters are conducted to a subtractor, in order to generate a differential signal between the demodulated filtered signal of the positive half wave and the demodulated filtered signal of the negative half wave. The differential signal is conducted to a digitization device, e.g. to an analog/digital converter. The subtractor may be realized by means of an operational amplifier formed as a differential amplifier. The microcontroller µC discharges a detection signal DS from the digitized differential signal and makes it available for further processing.

The signal generators G1 and G2 can be designed and configured respectively as already shown with respect to FIG. 20. The signal generators G1 and G2 can also be controlled by the microcontroller µC.

Figure 22:
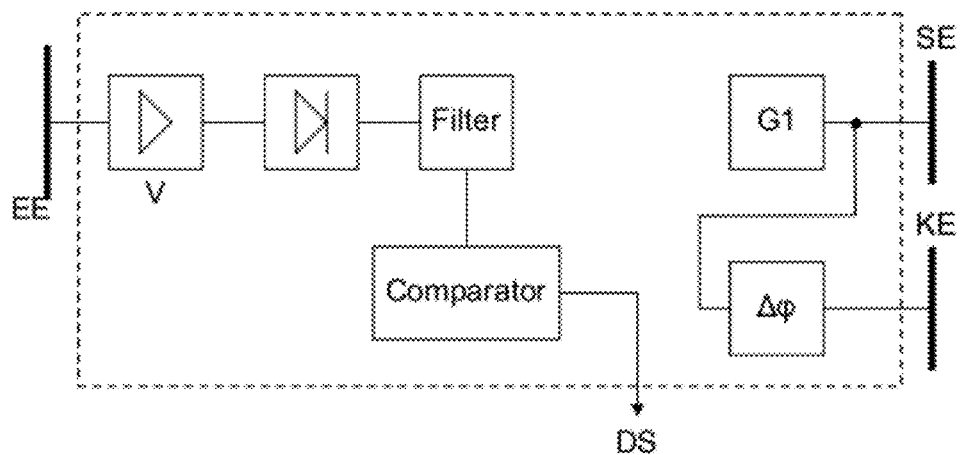

FIG. 22 shows a further possible implementation variant of a circuit arrangement according to the invention. A signal generator G1 provides an alternating electrical signal which is charged at the transmitting electrode SE. This alternating electrical signal, moreover, is conducted to a phase shifter $\Delta\phi$. The dephased alternating electrical signal resulting from this is charged at the compensation electrode KE.

Instead of a phase shifter $\Delta\phi$ an inverter may also be provided which inverts the signal provided by the signal generator G1 which corresponds to a phase shift of basically 180°.

This inverted alternating electrical signal may in turn be attenuated, so that the resulting alternating electrical signal comprises an amplitude which is smaller than the amplitude of the alternating signal provided by the signal generator.

The use of an inverter and an attenuator instead of a phase shifter is especially advantageous if the circuit arrangement is designed as an integrated component, for example an ASIC (Application Specific Integrated Circuit).

An electrical signal measured at the receiving electrode EE is conducted to an amplifying device V. The amplifying device can for example be a current/voltage transformer with a downstream voltage amplifier. The current/voltage transformer can be designed as a transimpedance amplifier. Both the voltage gain and the transimpedance are preferably adjustable.

The amplified signal provided by the amplifying device V, i.e. the tension provided, is conducted to a rectifier which can for example be operated synchronously to the generator G1. The detected signal is smoothed by means of a filter and afterwards conducted to a comparator which by means of a comparison of the conducted direct signal generates an output signal DS with a direct current and provides this output signal DS for further processing.

Figure 23:
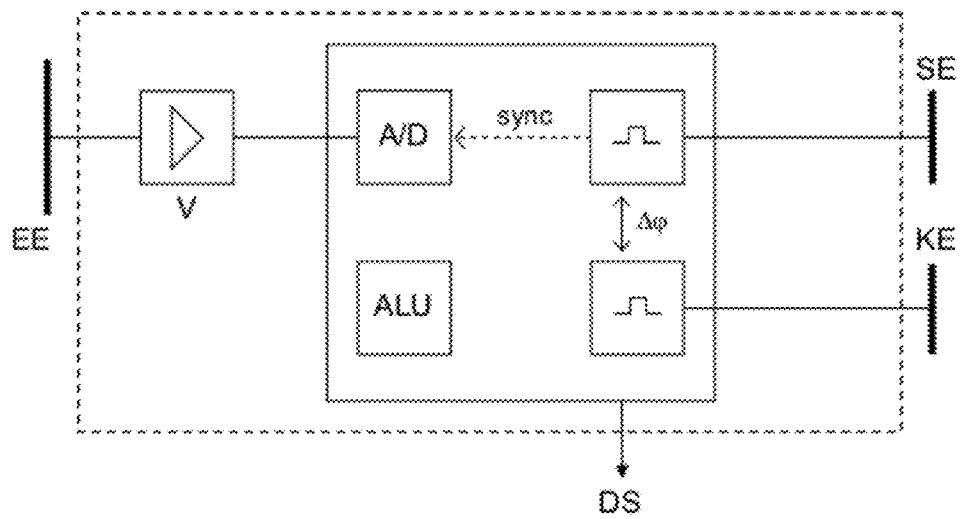

FIG. 23 shows a further embodiment of a circuit arrangement according to the invention. The alternating electrical signals charged at the transmitting electrode SE and at the compensation electrode KE are here provided by a microcontroller. The alternating electrical signal charged at the compensation electrode KE here is also dephased to the alternating electrical signal charged at the transmitting electrode SE.

An electrical signal measured at the receiving electrode EE is conducted to an amplifying device V which here can also be a current/voltage transformer with a downstream voltage amplifier. The current/voltage transformer can also be designed as a transimpedance amplifier. The amplified signal then is conducted to an analog-digital converter. The analog-digital converter can be operated synchronously to the alternating electrical signal which is charged at the transmitting electrode SE. Preferably, the amplified signal conducted to the analog-digital converter is scanned twice per period, wherein the phase of the scanning is preferably selected so as to scan and digitalize a peak value of the conducted amplified electrical signal in the first and in the second semi-period of the scanning. The phase of the scanning can be determined for example during an initialisation step of the circuit arrangement.

From the detected peak values, i.e. the positive peak values and the negative peak values, a rectification of the input signal may be produced by means of subtraction. A direct signal thus generated may then be used in turn for generating an output signal DS by the evaluator.

In the implementation variants shown in FIG. 18 to FIG. 23, the digitizing devices, i.e. the analog-digital converters, can each be realized with the help of a sample and hold element, wherein the output of the sample and hold element is conducted to an analog-digital converter. In the embodiment shown in FIG. 20, for example, two sample and hold elements can be provided, the outputs of which are coupled with an analog-digital converter in the time division multiplexing. The sample and hold elements can be operated synchronously to the signal of the signal generator.

In several embodiments shown here, it is advantageous to provide an attenuator, in order to attenuate the alternating signal to be charged at the compensation electrode KE, before the compensation electrode KE is charged with it.

In the embodiments shown in the aforementioned figures a current/voltage conversion can also be realized with the help of a shunt resistance. The digital processing and the production of a detector signal DS respectively can take place with a conventional microcontroller $\mu C$ or also with the help of a finite automaton (finite state machine).

Several of the circuit arrangements shown in FIG. 18 to FIG. 23 can be designed in such a way that, instead of providing an output signal DS, the circuit arrangement depending on the dielectric properties of the observation area of the capacitive sensor item, for example, puts a mobile phone directly into a sleeping mode and an active mode respectively.

The circuit arrangement according to the invention can be realized for example as an integrated component (ASIC) or using discrete components.

Figure 24:
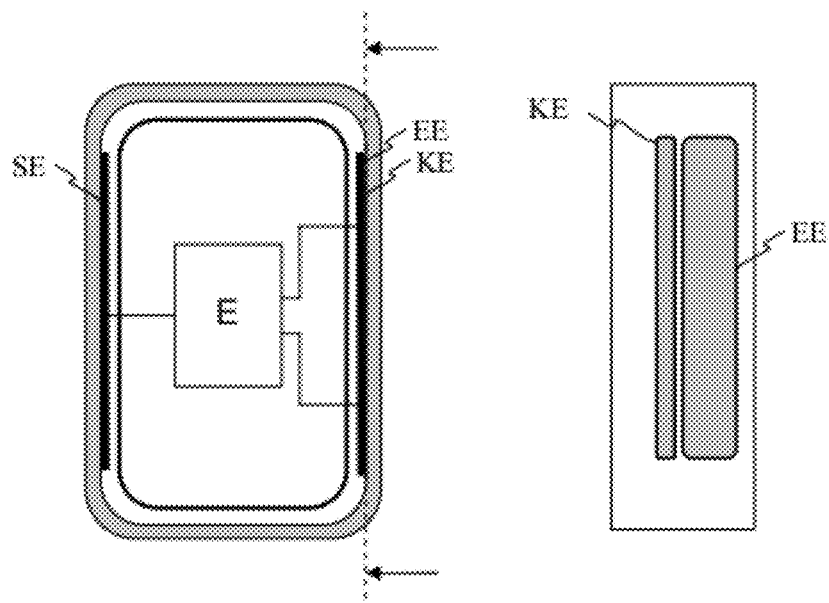

FIG. 24 shows an application example of a circuit arrangement according to the invention and a capacitive sensor element coupled with it. The circuit arrangement and the capacitive sensor element can be arranged and used respectively in an electric handset, for example, in a mobile phone, in order to detect an approach to the mobile phone and a grip of the mobile phone by a hand respectively. The detection of the approach and the grip respectively can be used for example in order to transfer the mobile phone from a sleeping mode into an active mode. The energy consumption of the mobile phone can thus be reduced drastically.

It is here advantageous that the user of the mobile phone does not have to actively make any entries in order to transfer the mobile phone from a sleeping mode into an active mode. The ease of use can thus be significantly increased. It is further advantageous that keys for switching the mobile phone from a sleeping mode into an active mode and from an active mode into a sleeping mode respectively can be dispensed with, which increases the degrees of freedom concerning the design of a mobile phone. The reduced energy consumption of the mobile phone is especially also reached due to the fact that while removing a hand from the mobile phone, the mobile phone can automatically be brought into a sleeping mode because, due to the too small capacitive coupling between the transmitting electrode SE and the receiving electrode EE, in the compensation electrode only a very small electric current flows which is indicative for the absence of a hand on the mobile phone.

It is advantageous to arrange the transmitting electrode SE at a first side wall of the mobile phone, and the compensation electrode KE, as well as the receiving electrode EE, at a second side wall of the mobile phone. It is thus guaranteed that a grip of the mobile phone is certainly detected because, while gripping the mobile phone, the hand at least partially covers the transmitting electrode SE at the first side wall, as well as the receiving electrode EE and the compensation electrode KE at the second side wall respectively.

As can be seen in the illustration on the right hand side of FIG. 24, the receiving electrode EE and the compensation electrode KE are arranged basically parallel to each other at the side wall of the mobile phone. The compensation electrode KE, the receiving electrode EE, and the transmitting electrode SE are coupled with an electronics system E. The electronics system E can here be realized as shown with respect to FIG. 19 to FIG. 23.

Figure 25:
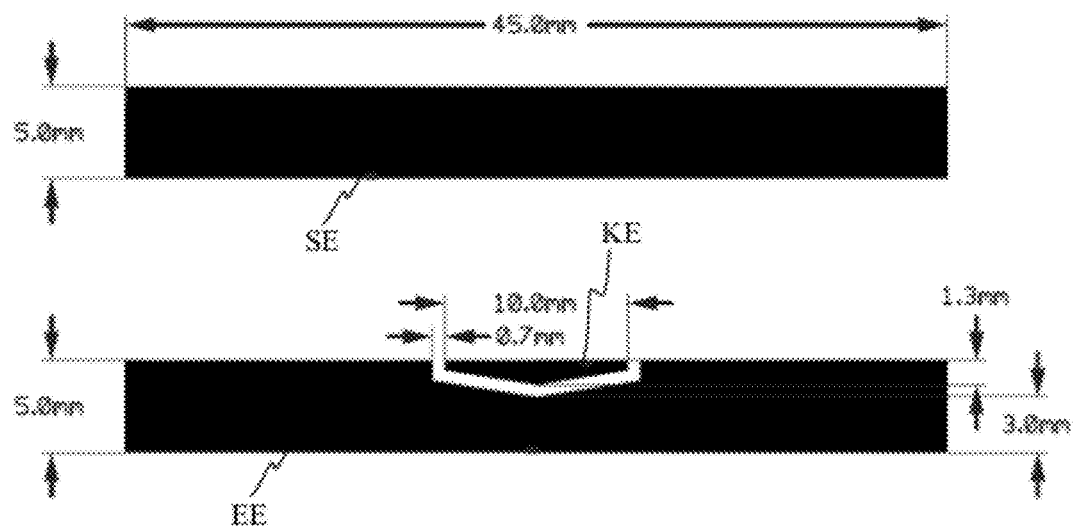

FIG. 25 shows an example of a configuration of the electrodes SE, EE and KE. The electrodes shown in FIG. 25 can be arranged, for example, at the top of a mobile phone or of a portable minicomputer (PDA). The transmitting electrode and the receiving electrode are here formed stripe-shaped, wherein the length of the electrodes each comprises roughly nine times the width of the electrode. The receiving electrode is basically arranged parallel to the transmitting electrode. The distance of the transmitting electrode from the receiving electrode can vary depending on the concrete application.

The receiving electrode comprises a recess at the edge orientated towards the transmitting electrode, in which the compensation electrode is arranged. The compensation electrode is arranged in the recess in such a way that it comprises no galvanic contact to the receiving electrode. The recess at the receiving electrode here is basically provided in the middle of the receiving electrode. Of course, the recess can also be selected larger, and selected at another area of the receiving electrode respectively which in turn depends on the concrete application. In any case it is important that the compensation electrode is basically arranged between the transmitting electrode and the receiving electrode.

The configuration of the receiving electrode shown in FIG. 25 and the compensation electrode embedded in it has the advantage that the receiving electrode and the compensation electrode can be particularly easily produced, due to the fact that the missing area between the compensation electrode and the receiving electrode can be produced, for example, by punching.

The specifications indicated in FIG. 25 have proved to be particularly advantageous for the arrangement of the electrodes on a mobile phone and on a portable minicomputer (PDA) respectively. Of course, several of the electrodes shown here can also comprise other sizes and areas respectively, depending on the concrete application.

The electrodes can, for example, be made in an electrically conductive material, for example in copper. Alternatively, the electrode can also be applied as an electrically conductive layer on the top surface of a housing. It is for example possible to produce the electrodes by means of an electrically conductive varnish.

The invention claimed is:

1. A detection device for an electrical hand-held mobile device for the detection of a gripping operation of the hand-held mobile device by a hand, comprising a housing enclosing the electrical hand-held device, the housing being configured to be picked up by a user, wherein the electric hand-held mobile device is mobile having only an internal ground reference and comprises a transmission electrode, a reception electrode and a compensation electrode, wherein the transmission electrode and the compensation electrode are galvanically coupled with each other, wherein the transmission electrode, the reception electrode and the compensation electrode are arranged on or within the housing separately from each other and wherein the reception electrode and the compensation electrode are arranged on or within the housing such that they are capacitively couplable, wherein the transmission electrode is supplied with a first electrical alternating voltage, so that a first electrical alternating field is irradiated from the transmission electrode, wherein the first electrical alternating voltage being couplable into the compensation electrode by means of galvanic coupling, and wherein the compensation electrode is supplied with a second electrical alternating voltage, whereby a second electrical alternating field is irradiated from the compensation electrode, resulting from the first electrical alternating voltage and the second electrical alternating voltage, wherein the second electrical alternating field being couplable into the reception electrode, in order to generate a first current, and wherein the first electrical alternating field is coupled into the reception electrode during a gripping of the hand held mobile device when a user hand partially surrounds the hand held mobile device, in order to generate a second current, whereby the total current resulting from the first current and the second current being indicative of the hand-held mobile device being gripped.

2. The detection device according to claim 1, wherein the first alternating voltage and the second alternating voltage have the same signal form and are dephased from each other.

3. The detection device according to claim 1, wherein the transmission electrode and the reception electrode are coupled with an evaluation electronics, which is developed to detect a hand gripping operation from a change of the total current.

4. The detection device according to claim 3, wherein the evaluation electronics comprises a control means, which is configured that, with a predetermined total current, higher than the first current in terms of amount, a switching-on mode and/or an active mode of the hand-held mobile device is activated.

5. The detection device according to claim 1, wherein the transmission electrode and the reception electrode are arranged on the hand-held mobile device such that they do not touch the surface in case of a hand-held mobile device being placed on a surface.

6. The detection device according to claim 5, wherein the gap between transmission electrode and surface and/or the gap between reception electrode and surface is selected such that the impedance between transmission electrode and reception electrode does not exceed a predetermined value, wherein the impedance between transmission electrode and reception electrode consists of the impedance between transmission electrode and surface, the impedance of the surface, and the impedance between surface and reception electrode, and wherein the predetermined value is selected such that the electrical alternating field irradiated on the transmission electrode is not coupled into the reception electrode.

7. The detection device according to claim 1, wherein the transmission electrode, the compensation electrode and the reception electrode being arrangeable on the surface of the hand-held mobile device.

8. The detection device according to claim 1, wherein the transmission electrode and the compensation electrode are coupled with a signal generator, wherein the transmission electrode and the compensation electrode are coupled to each other by means of a first phase shifter.

9. The detection device according to claim 5, wherein the transmission electrode and the compensation electrode are coupled with each other by a series connected phase shifter and resistor.

10. The detection device according to claim 5, wherein the signal generator is coupled with the compensation electrode by means of a second phase shifter.

11. The detection device according to claim 10, wherein the signal generator is coupled with the compensation electrode by means of a series connected second phase shifter and resistor.

12. The detection device according to claim 1, wherein the first current on the reception electrode can be regulated by changing the phase between the first alternating voltage and the second alternating voltage.

13. The detection device according to claim 1, wherein the transmission electrode and the compensation electrode are coupled with a signal generator, wherein the signal generator is coupled with the compensation electrode by a phase shifter.

14. The detection device according to claim 13, wherein the signal generator is coupled with the compensation electrode by a series connected phase shifter and adjustable resistor.

15. A method for the detection of the gripping of a hand-held mobile device by a hand with a detection device, comprising:
- a housing enclosing the electrical hand-held device, the housing being configured to be picked up by a user, wherein the electrical hand-held device is mobile comprising only an internal ground reference and comprises at least one transmission electrode, one reception electrode and one compensation electrode, wherein the transmission electrode is galvanically coupled with the compensation electrode and wherein the compensation electrode is capacitively coupled with the reception electrode, wherein the transmission electrode is supplied with a first electrical alternating voltage, so that a first electrical alternating field is irradiated on the transmission electrode, and wherein the first electrical alternating voltage is at least partially coupled into the compensation electrode by means of galvanic coupling; the compensation electrode is supplied with a second electrical alternating voltage, so that a second electrical alternating field is irradiated on the compensation electrode and coupled into the reception electrode, wherein the second electrical alternating field coupled into the reception electrode generates a first current in the reception electrode; and a total current is evaluated in the reception electrode, whereby the total current results from the first current and from the second current, wherein the second current is generated by means of capacitive coupling of the first electrical alternating field into the reception electrode during a gripping of the hand held mobile device when a user hand partially surrounds the hand held mobile device and whereby the total current is indicative for the hand-held mobile device being gripped by a hand.

16. The method according to claim 15, wherein the first alternating voltage and the second alternating voltage have the same signal form and are dephased from each other.

17. The method according to claim 15, wherein a switching-on mode and/or an active mode of the hand-held mobile device are induced, if the total current exceeds a predetermined threshold value; and/or a sleeping mode of the hand-held mobile device is induced, if the total current decreases below a predetermined threshold value.

18. A circuit arrangement for generating an output signal which is indicative for the dielectric properties of an observation area of at least one capacitive sensor element arranged within a mobile device, wherein the sensor element is arranged within a mobile device to detect at least a partial surrounding of the mobile device by a user hand lifting up the mobile device, wherein the circuit arrangement is configured to be arranged within the mobile device having only an internal ground reference and wherein the at least one capacitive sensor element comprises at least one transmitting electrode, at least one compensation electrode and at least one receiving electrode, and wherein the circuit arrangement comprises:
- a signal generator device for charging the transmitting electrode with a first alternating electrical signal and the compensation electrode with a second alternating electrical signal, wherein the second alternating electrical signal is different from the first alternating electrical signal,
- a signal processing device Which is coupled with the receiving electrode, for processing an electrical electrode signal measured at the receiving electrode and for providing a processed signal, and an evaluator, to which the processed signal can be fed, for evaluating the processed signal and for generating the output signal depending on the evaluation, wherein the signal processing device comprises an amplifying device for providing an electrical signal corresponding to the electrical electrode signal measured at the receiving electrode, and a digital converter device, to which the electrical signal of the amplifying device is fed, for digitizing the electrical signal and for providing the processed digitized signal.

19. The circuit arrangement according to claim 18, wherein the amplifying device is coupled with a first rectifier.

20. The circuit arrangement according to claim 19, wherein the amplifying device is coupled with a second rectifier.

21. The circuit arrangement according to claim 20, wherein the output of the first rectifier and the output of the second rectifier are each coupled with a filter, in order to smooth the signal applied at the respective rectifier.

22. The circuit arrangement according to claim 21, wherein the digital converter device comprises two analog-to-digital converters and wherein the outputs of the filters are each coupled with one of the two analog-to-digital converters.

23. The circuit arrangement according to claim 21, wherein the digital converter device comprises a multiplexer in order to conduct the signals applied at the outputs of the filters to an analog-to-digital converter, wherein the analog-to-digital converter comprises a sample-hold circuit.

24. The circuit arrangement according to claim 21, wherein the first rectifier and the second rectifier are formed as electronically controllable switches which are each opened and/or closed synchronously to edges of the first alternating electrical signal.

25. The circuit arrangement according to claim 20, wherein a subtractor is provided, to which the demodulated and smoothed output signals of the filters are conducted and wherein a differential signal of the subtractor is conducted to the digital converter device.

26. The circuit arrangement according to claim 18, wherein the digital converter device is operated synchronously to the first alternating electrical signal such that the electrical signal conducted to the digital converter device is sampled twice per period, wherein the phase of the sampling is selected such that in a first and in a second semi-period of the sampling a peak value of each conducted electrical signal is sampled and digitized.

27. The circuit arrangement according to claim 18, wherein the signal generator device comprises a signal generator which generates the first alternating electrical signal, and an inverter for generating the second alternating electrical signal from the first alternating electrical signal, wherein an attenuator is downstream to the inverter in order to attenuate the second alternating electrical signal, or
- a first signal generator which generates the first alternating electrical signal, and a second signal generator which generates the second alternating electrical signal, wherein the frequency of the first alternating electrical signal basically corresponds to the frequency of the second alternating electrical signal, or a signal generator which generates the first alternating electrical signal, and a phase shifter for generating the second alternating electrical signal from the first alternating electrical signal.

28. A circuit arrangement for generating an output signal which is indicative for dielectric properties of an observation area of at least one capacitive sensor element arranged within a mobile device having only an internal ground reference, wherein the circuit arrangement is configured to be arranged within the mobile device such that at least a partial surrounding of the mobile device by a user hand lifting up the mobile device is detected, and wherein the at least one capacitive sensor element comprises at least one transmitting electrode, at least one compensation electrode and at least one receiving electrode, and wherein the circuit arrangement comprises a signal generator device for charging the transmitting electrode with a first alternating electrical signal and the compensation electrode with a second alternating electrical signal, wherein the second alternating electrical signal is different from the first alternating electrical signal, an inverter for inverting the second alternating electrical signal, an attenuator for attenuating the second alternating electrical signal, a signal processing device which is coupled with the receiving electrode, for processing an electrical electrode signal measured at the receiving electrode and for providing a processed signal, and an evaluator, to which the processed signal can be fed, for evaluating the processed signal and for generating the output signal depending on the evaluation.

* * * * *

UNITED STATES PATENT AND TRADEMARK OFFICE
CERTIFICATE OF CORRECTION

PATENT NO.         : 9,236,860 B2                                  Page 1 of 1
APPLICATION NO.    : 12/745093
DATED              : January 12, 2016
INVENTOR(S)        : Reinhard Unterreitmayer et al.

It is certified that error appears in the above-identified patent and that said Letters Patent is hereby corrected as shown below:

Claims,

Column 31,
Claim 1, line 50, "…-ured to be picked up by a user, wherein the electric hand-held…" ---Change to---
"…-ured to be picked up by a user, wherein the electrical hand-held…"

Signed and Sealed this
Twelfth Day of April, 2016

Michelle K. Lee
*Director of the United States Patent and Trademark Office*